(12) United States Patent
Nagasaka et al.

(10) Patent No.: US 11,522,318 B2
(45) Date of Patent: Dec. 6, 2022

(54) CONNECTOR

(71) Applicant: Yazaki Corporation, Tokyo (JP)

(72) Inventors: Naokazu Nagasaka, Shizuoka (JP); Kaoru Sawairi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 37 days.

(21) Appl. No.: 17/381,368

(22) Filed: Jul. 21, 2021

(65) Prior Publication Data
US 2022/0029354 A1 Jan. 27, 2022

(30) Foreign Application Priority Data
Jul. 27, 2020 (JP) .............................. JP2020-126061

(51) Int. Cl.
| | |
|---|---|
| *H01R 13/639* | (2006.01) |
| *H01R 13/629* | (2006.01) |
| *H01R 13/516* | (2006.01) |
| *H01R 13/504* | (2006.01) |
| *H01R 12/77* | (2011.01) |

(52) U.S. Cl.
CPC ......... *H01R 13/639* (2013.01); *H01R 12/771* (2013.01); *H01R 13/5045* (2013.01); *H01R 13/516* (2013.01); *H01R 13/629* (2013.01)

(58) Field of Classification Search
CPC ................ H01R 13/639; H01R 12/771; H01R 13/5045; H01R 13/516
USPC ........................................................ 439/352
See application file for complete search history.

(56) References Cited

U.S. PATENT DOCUMENTS

| | | | | |
|---|---|---|---|---|
| 8,038,486 B1* | 10/2011 | Nakamura | ......... | H01R 13/4362 439/752 |
| 9,083,114 B2* | 7/2015 | Muro | .................. | H01R 13/4362 |
| 9,472,884 B2* | 10/2016 | Kutsuna | ............ | H01R 13/4362 |
| 10,135,171 B2* | 11/2018 | Noro | .................. | H01R 13/5205 |
| 10,158,189 B2* | 12/2018 | Kutsuna | ............ | H01R 13/4362 |
| 10,236,633 B2* | 3/2019 | Listing | ................. | H01R 13/707 |
| 10,312,626 B2* | 6/2019 | Vasbinder | ............ | H01R 13/631 |
| 10,355,387 B2* | 7/2019 | Hori | .................... | H01R 13/4362 |
| 10,862,237 B2* | 12/2020 | Jin | ......................... | H01R 13/424 |
| 11,128,090 B2* | 9/2021 | Mamiya | ............... | H01R 13/639 |
| 11,239,583 B2* | 2/2022 | Nagasaka | ............ | H01R 13/582 |

(Continued)

FOREIGN PATENT DOCUMENTS

| | | |
|---|---|---|
| JP | 2011-134656 A | 7/2011 |
| JP | 2016-219308 A | 12/2016 |

*Primary Examiner* — Alexander Gilman
(74) *Attorney, Agent, or Firm* — Sughrue Mion, PLLC

(57) ABSTRACT

In a connector, a main locking structure and an auxiliary locking structure are provided between a housing and a cover for maintaining the housing and the cover in a completely assembled state by locking the move of the cover in the connector removal direction with respect to the housing. The main locking structure includes: a first main locking body provided to a first housing sidewall and a second housing sidewall; and a second main locking body provided to a first cover sidewall and a second cover sidewall and engaged with the first main locking body. The auxiliary locking structure includes: a first auxiliary locking body provided to the first housing sidewall and the second housing sidewall; and a second auxiliary locking body provided to the first cover sidewall and the second cover sidewall on a second opening side than the second main locking body is.

20 Claims, 12 Drawing Sheets

(56) References Cited

U.S. PATENT DOCUMENTS

| | | | |
|---|---|---|---|
| 2005/0082840 A1* | 4/2005 | Ichida | H01R 13/633 |
| | | | 292/66 |
| 2012/0302085 A1 | 11/2012 | Kyoyama | |
| 2022/0029327 A1* | 1/2022 | Nagasaka | H01R 12/771 |
| 2022/0029354 A1* | 1/2022 | Nagasaka | H01R 13/516 |
| 2022/0115822 A1* | 4/2022 | Maesoba | H01R 13/639 |
| 2022/0131309 A1* | 4/2022 | Oomori | H01R 13/506 |
| 2022/0190500 A1* | 6/2022 | Wada | H01R 13/639 |
| 2022/0190537 A1* | 6/2022 | Wada | H01R 12/592 |
| 2022/0200207 A1* | 6/2022 | Ito | H01R 13/633 |
| 2022/0231445 A1* | 7/2022 | Sakai | H01R 13/4362 |
| 2022/0263273 A1* | 8/2022 | Murakami | H01R 13/502 |
| 2022/0271471 A1* | 8/2022 | Matsumoto | H01R 13/424 |

* cited by examiner

CONNECTOR

CROSS-REFERENCE TO RELATED APPLICATION(S)

The present application claims priority to and incorporates by reference the entire contents of Japanese Patent Application No. 2020-126061 filed in Japan on Jul. 27, 2020.

BACKGROUND OF THE INVENTION

1. Field of the Invention

The present invention relates to a connector.

2. Description of the Related Art

As conventionally known connectors, there is a type that includes a terminal fitting, a housing in which the terminal fitting is accommodated, a cover assembled to the housing, and a conductive component that is electrically connected to the terminal fitting and led out to the outer side from an opening formed by the housing and the cover. The housing includes a fitting connection part capable of being inserted to and removed from a mating fitting connection part, and the housing excluding at least the mating fitting connection part thereof is covered with the cover. This type of connector is disclosed in Japanese Patent Application Laid-open No. 2016-219308, for example.

Incidentally, with the connector, for making an electrically connected state between the terminal fitting and a mating terminal fitting, the fitting connection part is inserted and fitted to the mating fitting connection part along an inserting and fitting direction (connector fitting direction). Meanwhile, with the connector, for releasing the electrically connected state between the terminal fitting and the mating terminal fitting, the fitting connection part is pulled out from the mating fitting connection part along the opposite direction of the inserting and fitting direction (connector removal direction). When performing a connector removal operation from the mating fitting connection part, an operator holds the cover side of the connector and, at the same time, pulls it toward the connector removal direction. Thus, with the connector, it is desirable that the cover is caused not to come off from the housing even when a force is applied to the cover during the connector removal operation. On the other hand, it is necessary with the connector to suppress increase in the assembly force when assembling the housing and the cover.

SUMMARY OF THE INVENTION

It is therefore an object of the present invention to provide a connector capable of preventing the cover from coming off during the connector removal operation while suppressing the increase in the assembly force for the housing and the cover.

In order to achieve the above mentioned object, a connector according to one aspect of the present invention includes a terminal fitting; a housing that includes a fitting connection part capable of being fitted and connected to a mating fitting connection part along a connector insertion direction and capable of being pulled out from the mating fitting connection part along a connector removal direction, the housing accommodating the terminal fitting inside the fitting connection part; a cover that is assembled to the housing and covers a protruded part of the housing from the mating fitting connection part from an outer side when the fitting connection part and the mating fitting connection part are in a completely fitted and connected state; and a conductive component that is electrically connected to the terminal fitting and led out to an outer side from an outlet formed with the housing and the cover in a completely assembled state, wherein the cover includes: a cover main wall forming a main body for covering the protruded part; a first cover sidewall and a second cover sidewall having flexibility, the first cover sidewall and the second cover sidewall being opposingly disposed with a space provided from each other and being joined, respectively, to both ends of the cover main wall in an orthogonal state; a first opening having, as a peripheral edge, end portions of each of the cover main wall, the first cover sidewall, and the second cover sidewall on the connector insertion direction side; and a second opening having, as a peripheral edge, end portions of each of the cover main wall, the first cover sidewall, and the second cover sidewall in an orthogonal direction with respect to an opposingly disposed direction of the first cover sidewall and the second cover sidewall and with respect to the connector insertion direction, a part of the second opening being used as the outlet, the housing includes: a first housing sidewall disposed by opposing to the first cover sidewall in the completely assembled state; and a second housing sidewall disposed by opposing to the second cover sidewall in the completely assembled state, a main locking structure and an auxiliary locking structure are provided between the housing and the cover for locking move of the cover in the connector removal direction with respect to the housing when the housing and the cover are in the completely assembled state so as to maintain the housing and the cover in the completely assembled state, the main locking structure includes: a first main locking body that is provided to the housing; and a second main locking body that is provided to the cover, and engaged with the first locking body in the completely assembled state to maintain the housing and the cover in the completely assembled state, the auxiliary locking structure includes: a first auxiliary locking body that is provided to the housing; and a second auxiliary locking body that is provided to the cover on the second opening side than the second main locking body is, and engaged with the first auxiliary locking body in the completely assembled state to maintain the housing and the cover in the completely assembled state, the first main locking body and the first auxiliary locking body are provided to each of the first housing sidewall and the second housing sidewall, and the second main locking body and the second auxiliary locking body are provided to each of the first cover sidewall and the second cover sidewall.

According to another aspect of the present invention, in the connector, it is desirable that the first cover sidewall is formed to be flexibly deformed at least in a direction leaving away from the first housing sidewall, and the second cover sidewall is formed to be flexibly deformed at least in a direction leaving away from the second housing sidewall.

According to still another aspect of the present invention, in the connector, it is desirable that the second auxiliary locking body is disposed by opposing to the first auxiliary locking body on the connector insertion direction side, even when a lockable state between the first main locking body and the second main locking body is released due to deflection of the first cover sidewall and the second cover sidewall.

According to still another aspect of the present invention, in the connector, it is desirable that the second main locking body and the second auxiliary locking body are provided to each of the first cover sidewall and the second cover sidewall on the first opening side.

According to still another aspect of the present invention, in the connector, it is desirable that the second main locking body is provided to each of the first cover sidewall and the second cover sidewall on the first opening side, and the second auxiliary locking body is provided to each of the first cover sidewall and the second cover sidewall on the first opening side and the second opening side.

According to still another aspect of the present invention, in the connector, it is desirable to further include a grip part that is provided to outer wall faces of each of the first cover sidewall and the second cover sidewall on the connector removal direction side, the grip part being able to be caught and held by a finger when the fitting connection part is pulled out from the mating fitting connection part.

According to still another aspect of the present invention, in the connector, it is desirable that the housing includes: a locking body that is engaged with a mating locking body provided to the mating fitting connection part when the fitting connection part and the mating fitting connection part are in the completely fitted and connected state so as to maintain the fitting connection part and the mating fitting connection part in the completely fitted and connected state; and a locking release arm that releases a lockable state of the locking body and the mating locking body, the locking body and the locking release arm are disposed in the housing on an opposite side of the second opening side in the completely assembled state, the locking release arm includes a force point to be pushed and operated toward the second opening side when releasing the lockable state of the locking body and the mating locking body, and the cover includes a pushing part that covers the force point and pushes and moves the force point toward the second opening side by being displaced toward the second opening side.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

Figure 1:
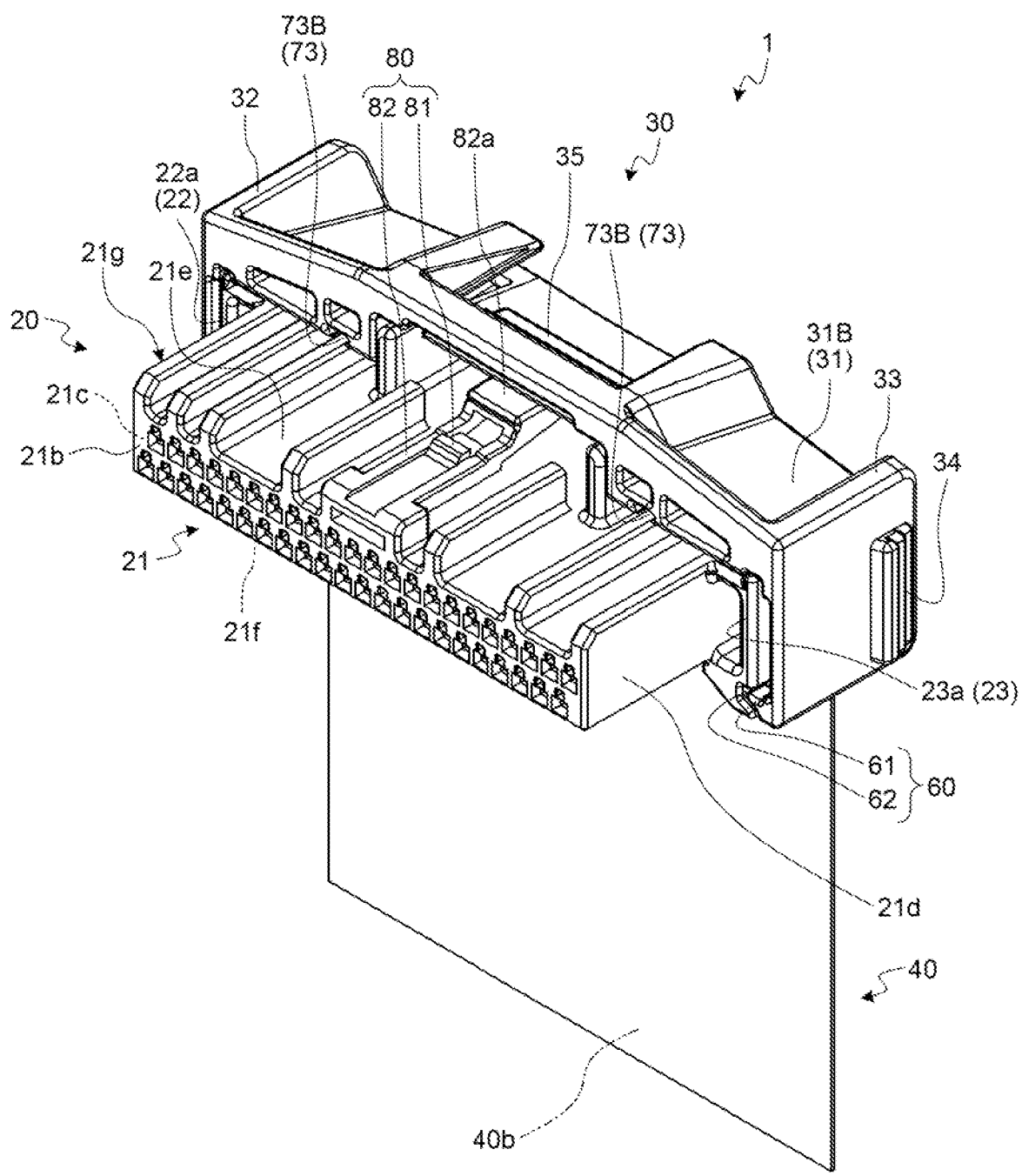
FIG. 1 is a perspective view illustrating a connector of an embodiment.

Hereinafter, an embodiment of a connector according to the present invention will be described in detail with reference to the accompanying drawings. Note that the invention is not limited to this embodiment.

Embodiment

One embodiment of the connector according to the present invention will be described with reference to FIG. 1 to FIG. 12.

Reference numeral 1 in FIG. 1 to FIG. 8 indicates the connector of the embodiment. The connector 1 includes: a terminal fitting 10; a housing 20 in which the terminal fitting 10 is accommodated; a cover 30 assembled to the housing 20; and a conductive component 40 that is physically and electrically connected to the terminal fitting 10 in an inner space formed with the housing 20 and the cover 30 in an assembled state, and led out to an outer side from the inner space.

While a sheet type such as a flexible printed circuit will be described later in detail as the conductive component 40, a cable may be used instead of the sheet type. Furthermore, as for the conductive component 40, it is also possible to use what is called a busbar formed with a conductive material and a cable electrically connected to the busbar. In this case, in the connector 1, the busbar and the terminal fitting 10 are electrically connected and then the cable electrically connected to the busbar is led out to the outer side from the inner space formed by the housing 20 and the cover 30 in a completely assembled state.

Figure 7:
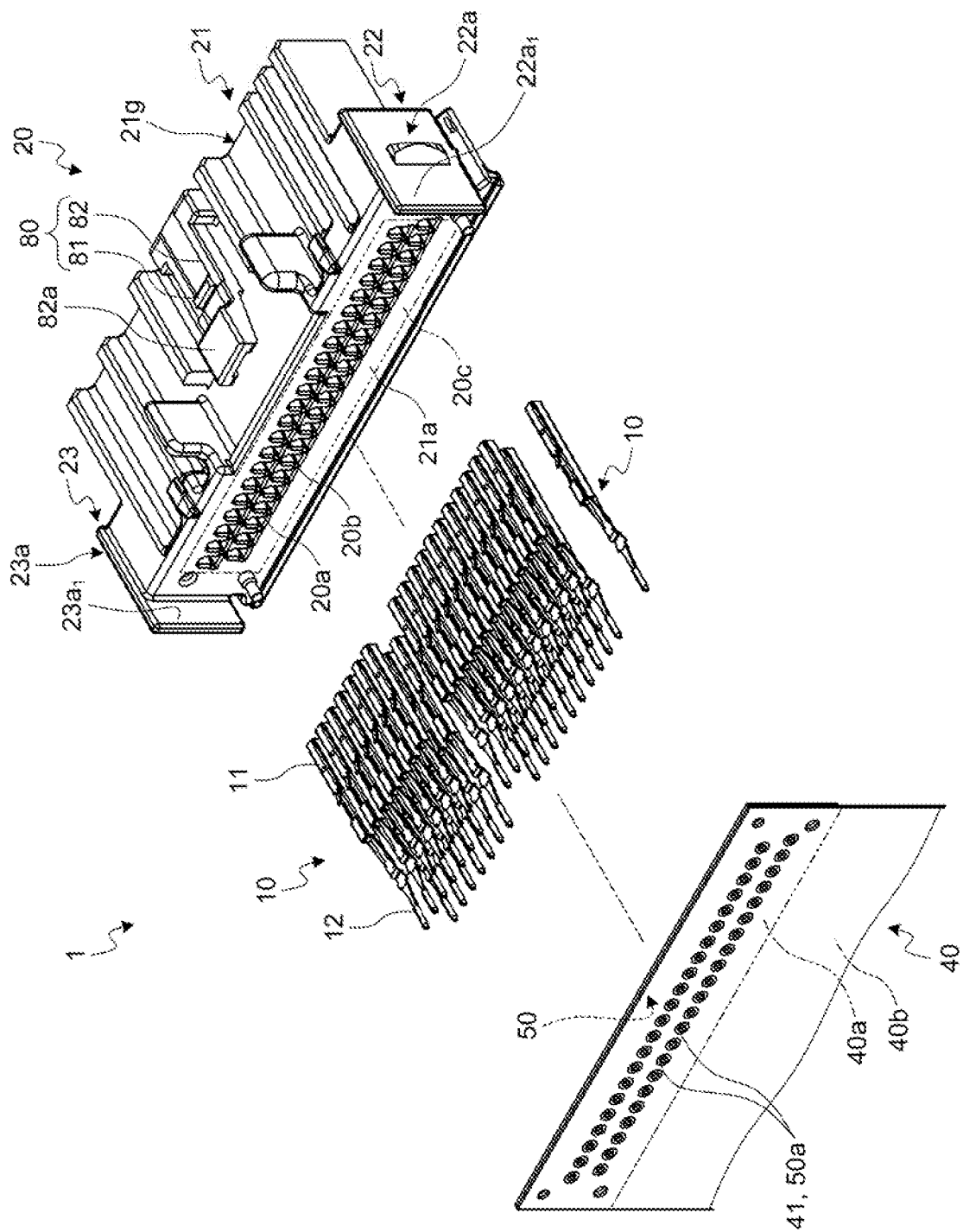
FIG. 7 is an exploded perspective view illustrating the connector (excluding the cover) of the embodiment.
Figure 8:
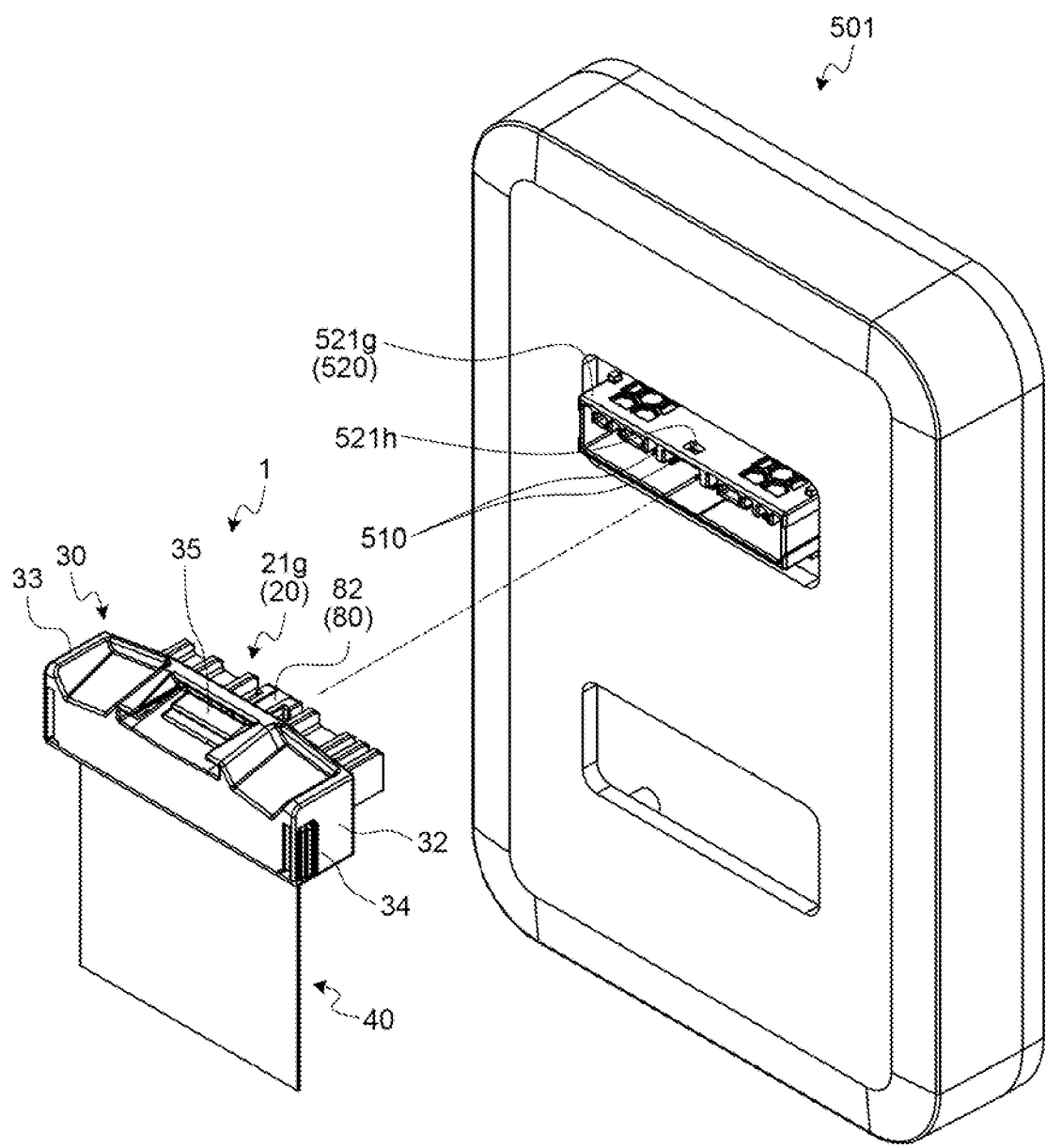
FIG. 8 is a perspective view illustrating the connector of the embodiment along with a mating connector.

The terminal fitting 10 is formed with a conductive material such as metal. For example, the terminal fitting 10 is shaped in a prescribed shape by press molding such as folding work and cutting work performed on a metal plate as a base material. The terminal fitting 10 includes a terminal part 11 that is physically and electrically connected to a mating terminal fitting 510 of a mating connector 501 (FIG. 8), and a conductor connection part 12 that is physically and electrically connected to the conductive component 40 (FIG. 7). Note that the mating connector 501 may be a connector that is electrically connected to a mating electric device (inverter or the like) or may be a part like a connector part of a terminal block provided to the mating electric device, for example.

The terminal part 11 is formed in a female terminal shape or a male terminal shape, for example. The terminal part 11 discussed herein is formed in a female terminal shape having a rectangular tubular box body, and the mating terminal fitting 510 is inserted and extracted along the axial direction thereof. Furthermore, the conductor connection part 12 is formed in a cylindrical shape with its axial direction facing in the same direction as the axial direction of the terminal part 11.

The connector 1 of the embodiment is configured by including a single or a plurality of the terminal fittings 10. The connector 1 discussed herein includes a plurality of the terminal fittings 10.

The housing 20 is shaped with an insulating material such as a synthetic resin. As for the housing 20, the terminal part 11 of the terminal fitting 10 is accommodated in an inner housing chamber 20a, and the conductor connection part 12 of the terminal fitting 10 is projecting toward an outer side from an opening (hereinafter, referred to as "terminal outlet") 20b of the housing chamber 20a (FIG. 7). Therefore, the housing 20 includes a terminal lead-out area 20c where the terminal outlet 20b is provided (FIG. 7). With the housing 20, the terminal part 11 is accommodated in the housing chamber 20a from the terminal outlet 20b, and the conductor connection part 12 is projecting from the terminal outlet 20b in the direction opposite from a connector fitting direction to a mating connector 501 (that is, in a connector removal direction).

In the housing 20 discussed herein, a plurality of the housing chambers 20a are provided, and the terminal part 11 is accommodated in each of the housing chambers 20a. All of the housing chambers 20a are formed such that the terminal part 11 is accommodated in each of the housing chambers 20a by facing toward the same direction and that each of the terminal outlets 20b is arranged on the same plane. Furthermore, in the housing 20, all of the housing chambers 20a are arranged in a grid like form. Therefore, the housing 20 discussed herein includes the rectangular terminal lead-out area 20c where the terminal outlets 20b are provided.

In the connector 1, it is not necessary to accommodate the terminal fitting 10 in all of the housing chambers 20a but only need to accommodate the terminal fitting 10 in the housing chambers 20a at the places required on an electric circuit.

The housing 20 discussed herein includes a housing main body 21 where all of the housing chambers 20a are formed (FIG. 1 to FIG. 7). The housing main body 21 illustrated herein is formed in a cuboid shape, and includes a first to sixth outer wall faces 21a to 21f (FIG. 1, FIG. 2, and FIG. 4 to FIG. 7).

All of the terminal outlets 20b are arranged on the first outer wall face 21a. Therefore, the terminal lead-out area 20c is provided on the first outer wall face 21a (FIG. 7).

In the housing main body 21, the third outer wall face 21c and the fourth outer wall face 21d are arranged in a parallel state, and joined to the first outer wall face 21a in an orthogonal state. In the housing 20, the conductor connection parts 12 of all of the terminal fittings 10 projecting from the terminal outlets 20b are covered from the third outer wall face 21c side and the fourth outer wall face 21d side for protection. Therefore, the housing 20 includes: a first protector 22 that is connected in an opposingly disposed state with respect to the third outer wall face 21c with a space provided therebetween, and also protruded outward of the first outer wall face 21a; and a second protector 23 that is connected in an opposingly disposed state with respect to the fourth outer wall face 21d with a space provided therebetween, and also protruded outward of the first outer wall face 21a (FIG. 1 to FIG. 7).

The first protector 22 and the second protector 23 are arranged in a part of the housing main body 21 excluding a fitting connection part 21g (FIG. 1 and FIG. 4 to FIG. 7). The fitting connection part 21g is a part that can be fitted and connected into a mating fitting connection part 521g of a mating housing 520 (FIG. 8) along the connector insertion direction and can be pulled out from the inner side of the mating fitting connection part 521g along the connector removal direction, and the terminal fitting 10 is accommodated inside thereof. The fitting connection part 21g is provided on the second outer wall face 21b side of the housing main body 21. Therefore, the first protector 22 and the second protector 23 are arranged on the first outer wall face 21a side of the housing main body 21. Furthermore, in the housing 20, the first protector 22 is disposed at an end on one of the sides, and the second protector 23 is disposed at an end on the other side. Therefore, hereinafter, the first protector 22 is referred to as a "first housing sidewall 22" and the second protector 23 as a "second housing sidewall 23" as necessary.

The first protector 22 illustrated herein includes a rectangular planar flat plate part 22a that is opposingly disposed in a parallel state with respect to the third outer wall face 21c with a space provided therebetween (FIG. 1, FIG. 2, and FIG. 4 to FIG. 7). In the first protector 22, the flat plate part 22a includes a protruded part $22a_1$ that is protruded outward of the first outer wall face 21a, and the conductor connection parts 12 of all of the terminal fittings 10 are covered with the protruded part $22a_1$ from the third outer wall face 21c side. Furthermore, the second protector 23 illustrated herein includes a rectangular planar flat plate part 23a that is opposingly disposed in a parallel state with respect to the fourth outer wall face 21d with a space provided therebetween (FIG. 1, FIG. 2, and FIG. 4 to FIG. 7). In the second protector 23, the flat plate part 23a includes a protruded part $23a_1$ that is protruded outward of the first outer wall face 21a, and the conductor connection parts 12 of all of the terminal fittings 10 are covered with the protruded part $23a_1$ from the fourth outer wall face 21d side.

Furthermore, in the housing main body 21, the fifth outer wall face 21e and the sixth outer wall face 21f are arranged in a parallel state and joined, in an orthogonal state, to each of the first outer wall face 21a, the third outer wall face 21c, and the fourth outer wall face 21d. With the connector 1 discussed herein, the conductive component 40 is led toward the sixth outer wall face 21f side as will be described later.

With the connector 1, before assembling the cover 30 to the housing 20, the conductive component 40 is connected to the terminal fittings 10 accommodated in the housing chambers 20a.

For the conductive component 40 of the embodiment, a sheet type is used. The sheet-like conductive component 40 is a flat laminate formed by a conductor and an insulator having flexibility (pliability, so to speak). The conductive component 40 includes a plurality of conductors, and a circuit pattern is formed with each of the conductors. Examples of the conductive component 40 may be a printed circuit body such a flexible printed circuit (what is called FPC) and a membrane wiring board, a flat cable (what is called FC), a flexible flat cable (what is called FPC), and the like. The conductive component 40 discussed herein is a flexible printed circuit (what is called FPC), and it is formed in a rectangular shape.

Figure 5:
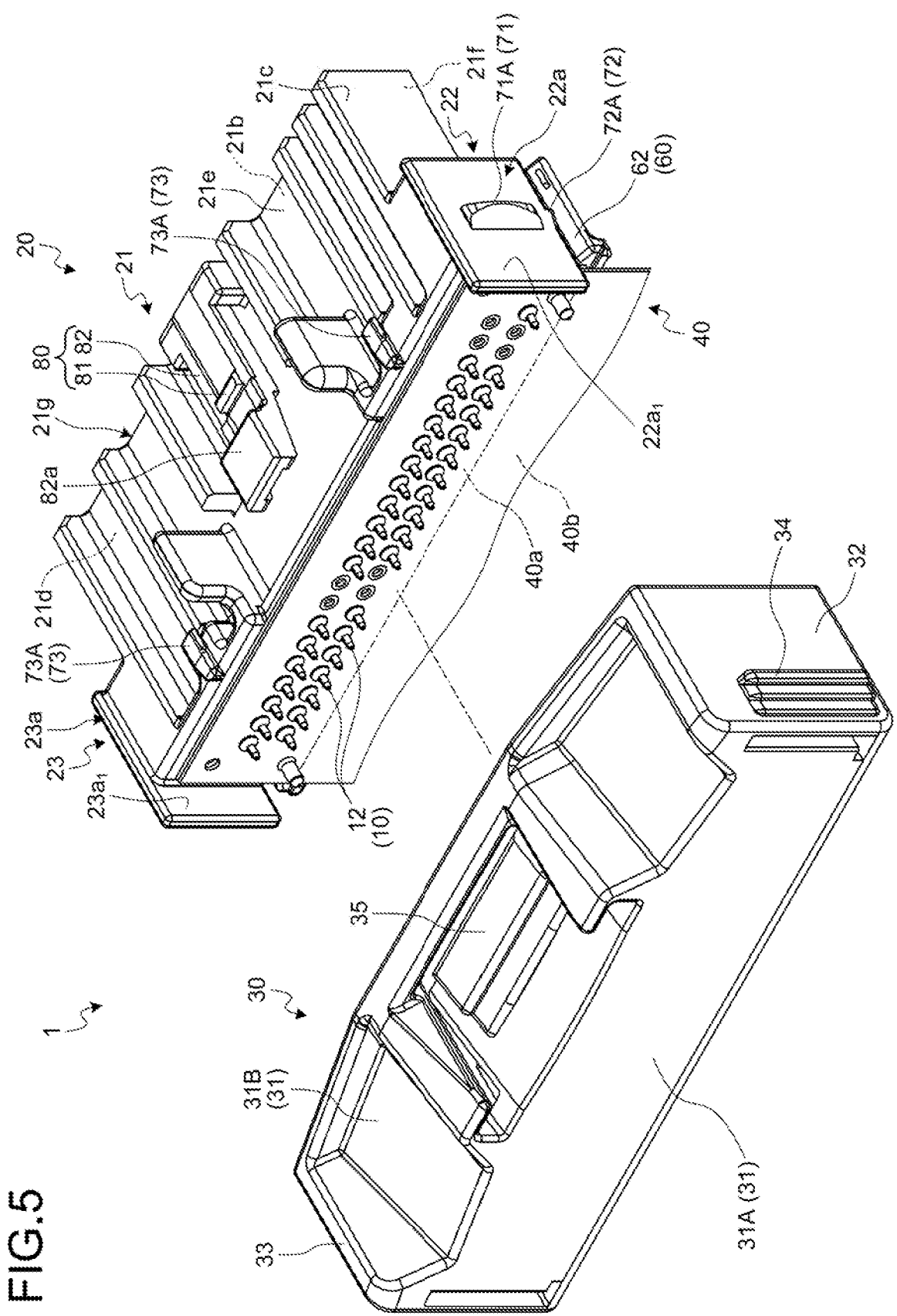
FIG. 5 is an exploded perspective view of the connector before the cover is connected when viewed from another angle.

The conductive component 40 includes: a conductor connection area 40a that is accommodated in the inner space formed with the housing 20 and the cover 30 in a completely assembled state and electrically connects the conductor to the conductor connection part 12 of the terminal fitting 10 projecting from the terminal outlet 20b; and a lead-out area 40b that is led out from an outlet 30c formed with the housing 20 and the cover 30 in the completely assembled state (FIG. 5 and FIG. 7). The conductive component 40 discussed herein is sectioned into the rectangular conductor connection area 40a and the rectangular lead-out area 40b.

The conductor connection area 40a includes a through-hole 41 that is a perforated hole for inserting the conductor connection part 12, and that allows the electric connection part of the conductor on an inner circumferential face of the perforated hole to be electrically connected to the conductor connection part 12 (FIG. 7). In the conductor connection area 40a, the through-hole 41 in a circular shape is formed for each of the terminal fittings 10 for electrically connecting the conductor connection parts 12 of all of the terminal fittings 10.

Note here that a reinforcing plate 50 is integrated with the conductor connection area 40a in a laminated state (FIG. 7). The reinforcing plate 50 is formed in a shape with an insulating material such as a synthetic resin. The reinforcing plate 50 discussed herein is formed as a flat plate having an outer shape same as that of the conductor connection area 40a (that is, in a rectangular shape same as that of the conductor connection area 40a). By adhering the reinforcing plate 50 to the conductor connection area 40a with an adhesive or the like, the reinforcing plate 50 is integrated with the conductor connection area 40a in a laminated state.

The reinforcing plate 50 is interposed between the terminal lead-out area 20c of the housing main body 21 and the conductor connection area 40a of the conductive component 40. Therefore, in the reinforcing plate 50, a perforated hole (hereinafter, referred to as "terminal insertion hole") 50a concentric with the through-hole 41 is formed for each of the through-holes 41 (FIG. 7). The terminal insertion hole 50a discussed herein is formed in the same shape as that of the through-hole 41.

For example, in a laminated part configured with the conductor connection area 40a and the reinforcing plate 50 discussed herein, the conductor connection parts 12 of all of the terminal fittings 10 accommodated in the housing chambers 20a are inserted into the through-holes 41 and the terminal insertion holes 50a, so that the reinforcing plate 50 is placed on the terminal lead-out area 20c of the housing main body 21. As for the connector 1, in a state where the terminal fittings 10, the housing 20, the conductive component 40, and the reinforcing plate 50 are mounted, soldering is performed for each combination of the conductor connection part 12 and the through-hole 41 as a pair so as to fix the conductor connection part 12 and the through-hole 41. Thereafter, the cover 30 is assembled to the connector 1.

The cover 30 is formed with an insulating material such as a synthetic resin. The cover 30 is assembled to the housing 20 to cover the housing 20 from the outer side. Specifically, the cover 30 is formed to cover the part of the housing 20 projecting from the mating fitting connection part 521g from the outer side, when the fitting connection part 21g and the mating fitting connection part 521g are in a completely fitted and connected state. In other words, the cover 30 is formed to cover the remaining part of the housing 20 in a state where the fitting connection part 21g projects from the inner space within the cover. Therefore, the cover 30 covers the terminal lead-out area 20c (that is, the conductor connection parts 12 of all of the terminal fittings 10 projecting from the terminal outlet 20b).

Figure 3:
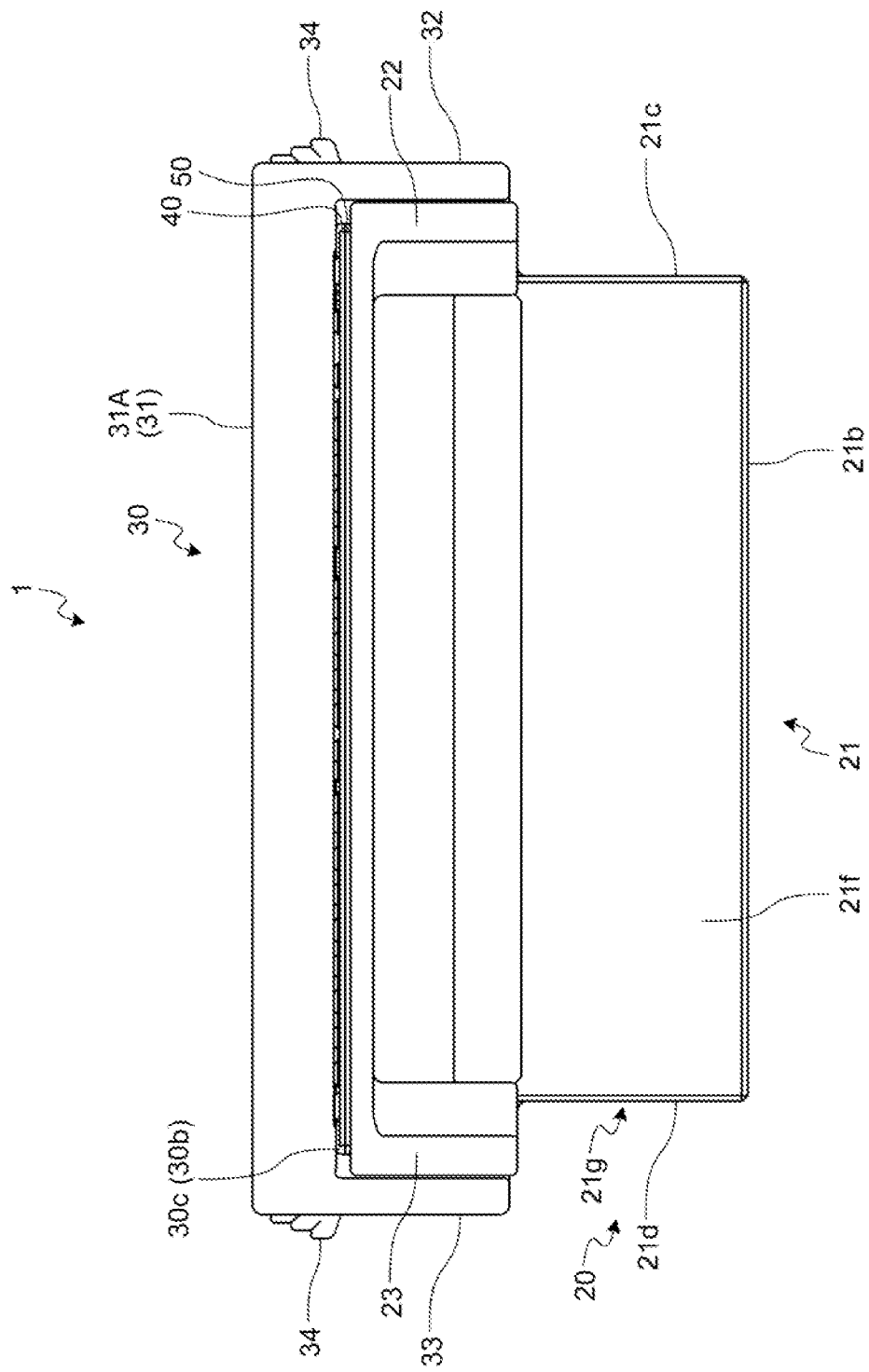
FIG. 3 is a plan view of the connector of the embodiment when viewed from an outlet side.
Figure 4:
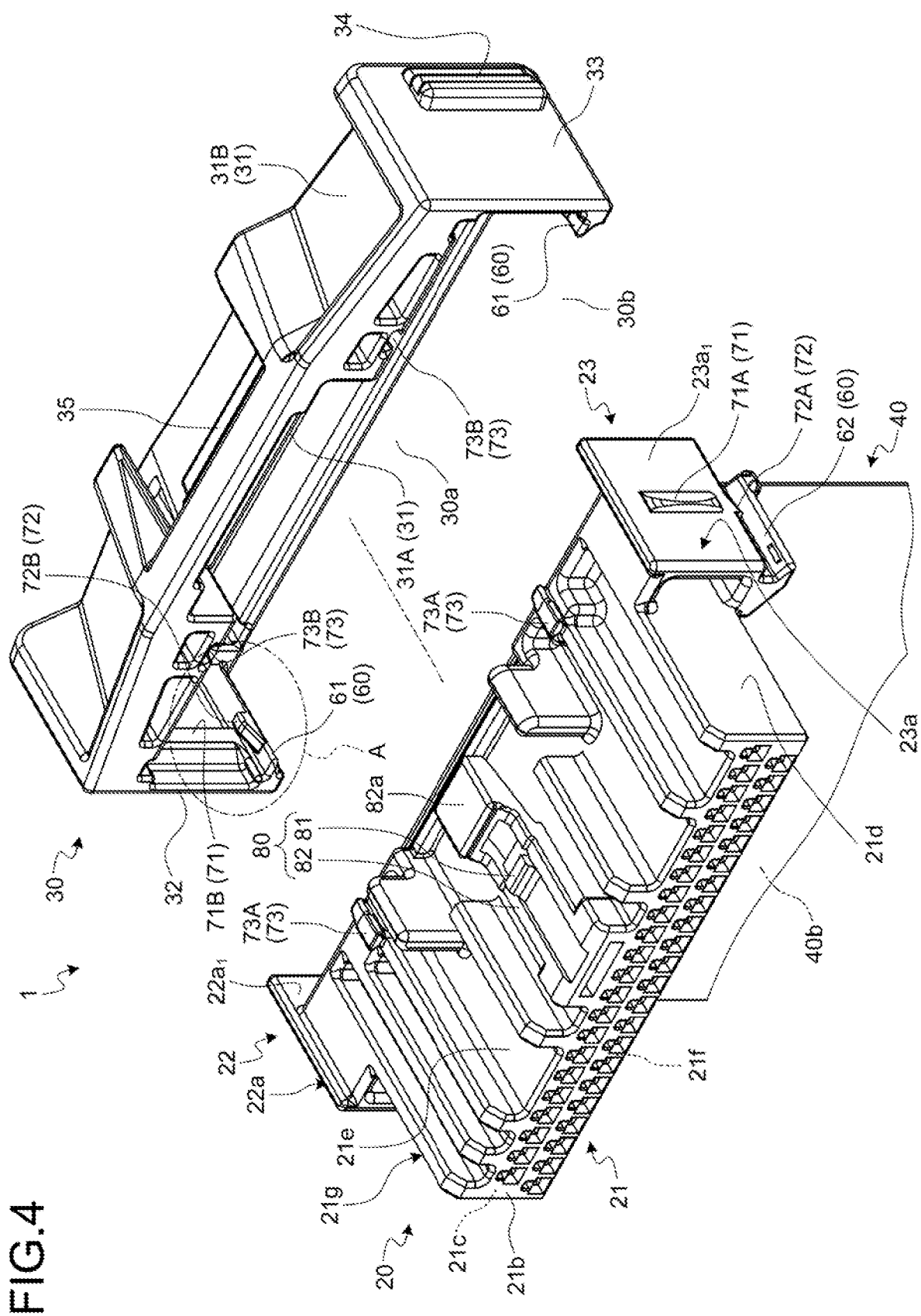
FIG. 4 is an exploded perspective view of the connector before a cover is connected.
Figure 6:
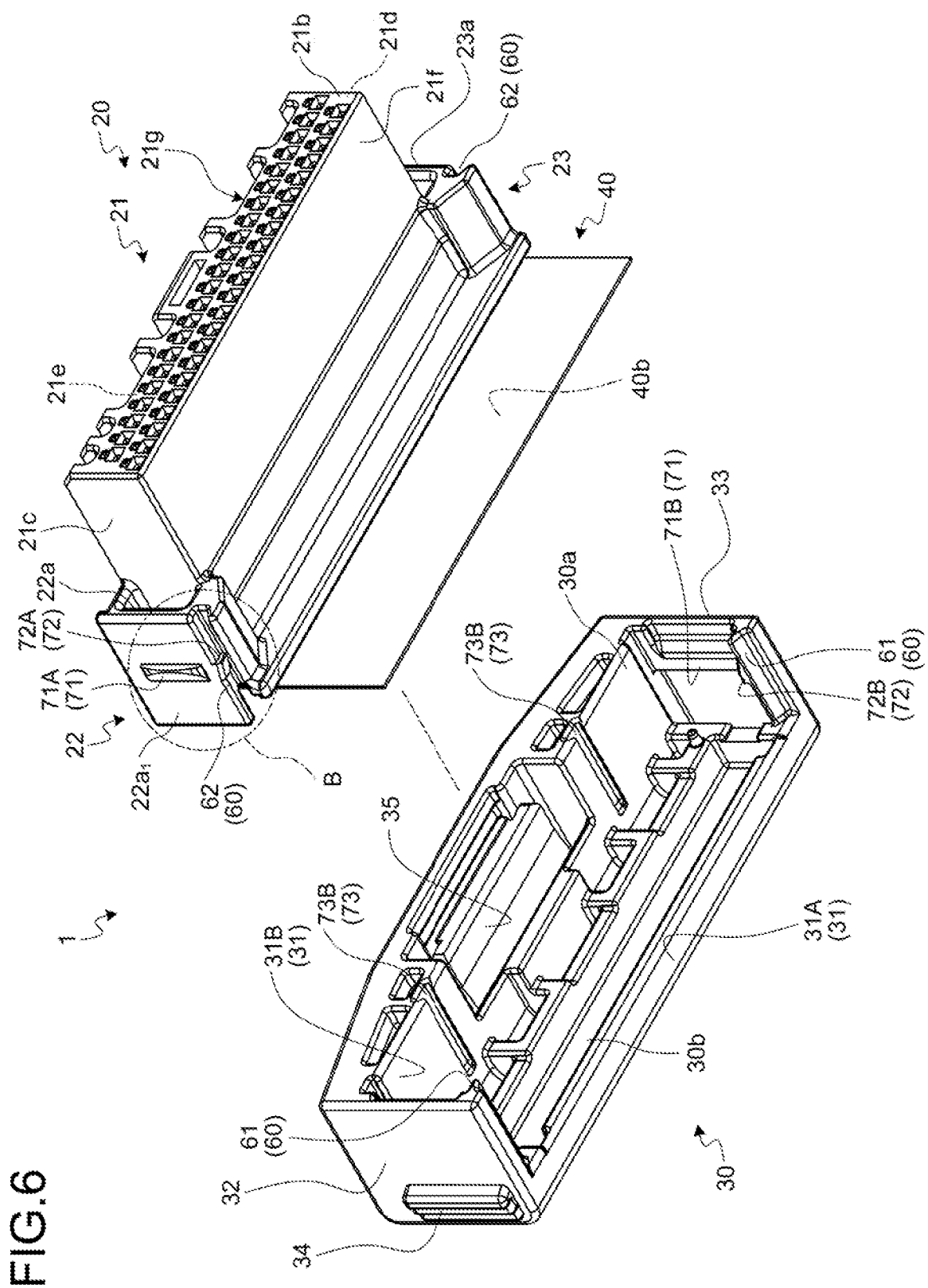
FIG. 6 is an exploded perspective view of the connector before the cover is connected when viewed from still another angle.

The cover 30 includes a cover main wall 31 that forms the main body for covering the protruded part mentioned above (the protruded part of the housing 20 from the mating fitting connection part 521g when the fitting connection part 21g and the mating fitting connection part 521g are in a completely fitted and connected state) (FIG. 1 and FIG. 3 to FIG. 6). The cover main wall 31 discussed herein includes a first wall body 31A and a second wall body 31B joined in an intersecting state (FIG. 4 to FIG. 6). As for the cover 30, the first wall body 31A is disposed by opposing to the first outer wall face 21a with a space provided therebetween, and the second wall body 31B is disposed by opposing to the first outer wall face 21a side of the fifth outer wall face 21e with a space provided therebetween.

Furthermore, the cover 30 includes a first cover sidewall 32 and a second cover sidewall 33 having flexibility, which are opposingly disposed with a space provided therebetween and joined, respectively, to both ends of the cover main wall 31 in an orthogonal state (FIG. 1 and FIG. 3 to FIG. 6). The first cover sidewall 32 and the second cover sidewall 33 are opposingly disposed with a space provided therebetween in the orthogonal direction to the connector insertion direction (or the connector removal direction) and to the lead-out direction of the conductive component 40 (hereinafter, referred to as "width direction"). Furthermore, the first cover sidewall 32 and the second cover sidewall 33 are joined in an orthogonal state, respectively, to both ends of the cover main wall 31 in the width direction (both ends of each of the first wall body 31A and the second wall body 31B).

In the cover 30 when being completely assembled to the housing 20, the first cover sidewall 32 in a planar shape is disposed by opposing to the flat plate part 22a of the first housing sidewall 22 from the outer side in a parallel state, and the second cover sidewall 33 in a planar shape is disposed by opposing to the flat plate part 23a of the second housing sidewall 23 from the outer side in a parallel state. The first cover sidewall 32 is formed to be flexibly deformed at least in a direction leaving away from the first housing sidewall 22. Furthermore, the second cover sidewall 33 is formed to be flexibly deformed at least in a direction leaving away from the second housing sidewall 23.

The cover 30 includes: a first opening 30a having, as its peripheral edge, end portions of each of the cover main wall 31, the first cover sidewall 32, and the second cover sidewall 33 on the connector insertion direction side; and a second opening 30b which has, as its peripheral edge, end portions of each of the cover main wall 31, the first cover sidewall 32, and the second cover sidewall 33 in the lead-out direction of the conductive component 40 (that is, the orthogonal direction to the opposingly disposed direction of the first cover sidewall 32 and the second cover sidewall 33 (width direction) and to the connector insertion direction (or the connector removal direction)), and a part of which is used as the outlet 30c of the conductive component 40 to be described later (FIG. 4 and FIG. 6). The first opening 30a discussed herein is disposed by opposing to the first wall body 31A on the connector insertion direction side with a space provided therebetween, and it is formed as an opening having the side portions of each of the second wall body 31B, the first cover sidewall 32, and the second cover sidewall 33 as the peripheral edge. Furthermore, the second opening 30b discussed herein is disposed by opposing to the second wall body 31B with a space provided therebetween, and it is formed as an opening having the side portions of each of the first wall body 31A, the first cover sidewall 32, and the second cover sidewall 33 as the peripheral edge. In the cover 30, the first opening 30a and the second opening 30b are joined in an orthogonal state. Therefore, each of the first cover sidewall 32 and the second cover sidewall 33 has the largest deflection amount in the intersection part where the first opening 30a intersects with the second opening 30b.

In the connector 1, a space is formed between the first outer wall face 21a of the housing main body 21, the protruded part 22a$_1$ of the first protector 22, and the protruded part 23a$_1$ of the second protector 23, as well as the first wall body 31A and the second wall body 31B of the cover 30, and the conductor connection parts 12 of all of the terminal fittings 10 are arranged in the space. Furthermore, as for the connector 1, the space communicates with the outer side via a part of the second opening 30b. That part of the second opening 30b is a gap formed between the housing 20 and the first wall body 31A (FIG. 3). Therefore, in the connector 1, the gap is the opening (hereinafter, referred to as "outlet") 30c from which the conductive component 40 is pulled out to the outer side from the sixth outer wall face 21f side.

The cover 30 is inserted and connected to the housing 20 from the first outer wall face 21a side along the connector fitting direction. Between the housing 20 and the cover 30, a guide structure 60 is provided for guiding those with each other to the completely assembled position along the connecting direction thereof (FIG. 1, FIG. 2, FIG. 4, FIG. 6, and FIG. 9). The guide structure 60 is a protrusion provided to one of the housing 20 and the cover 30, and includes: a guide protrusion 61 extended along the connecting direction with a wedge-shaped orthogonal section to the connecting direction; and a guide groove 62 that is a groove provided to the other of the housing 20 and the cover 30, which is extended along the connecting direction for being guided and for guiding the inserted guide protrusion 61 along the connecting direction. The guide protrusion 61 and the guide groove 62 at least have two planes in parallel to or intersecting with each other along the connecting direction of the housing 20 and the cover 30.

Figure 9:
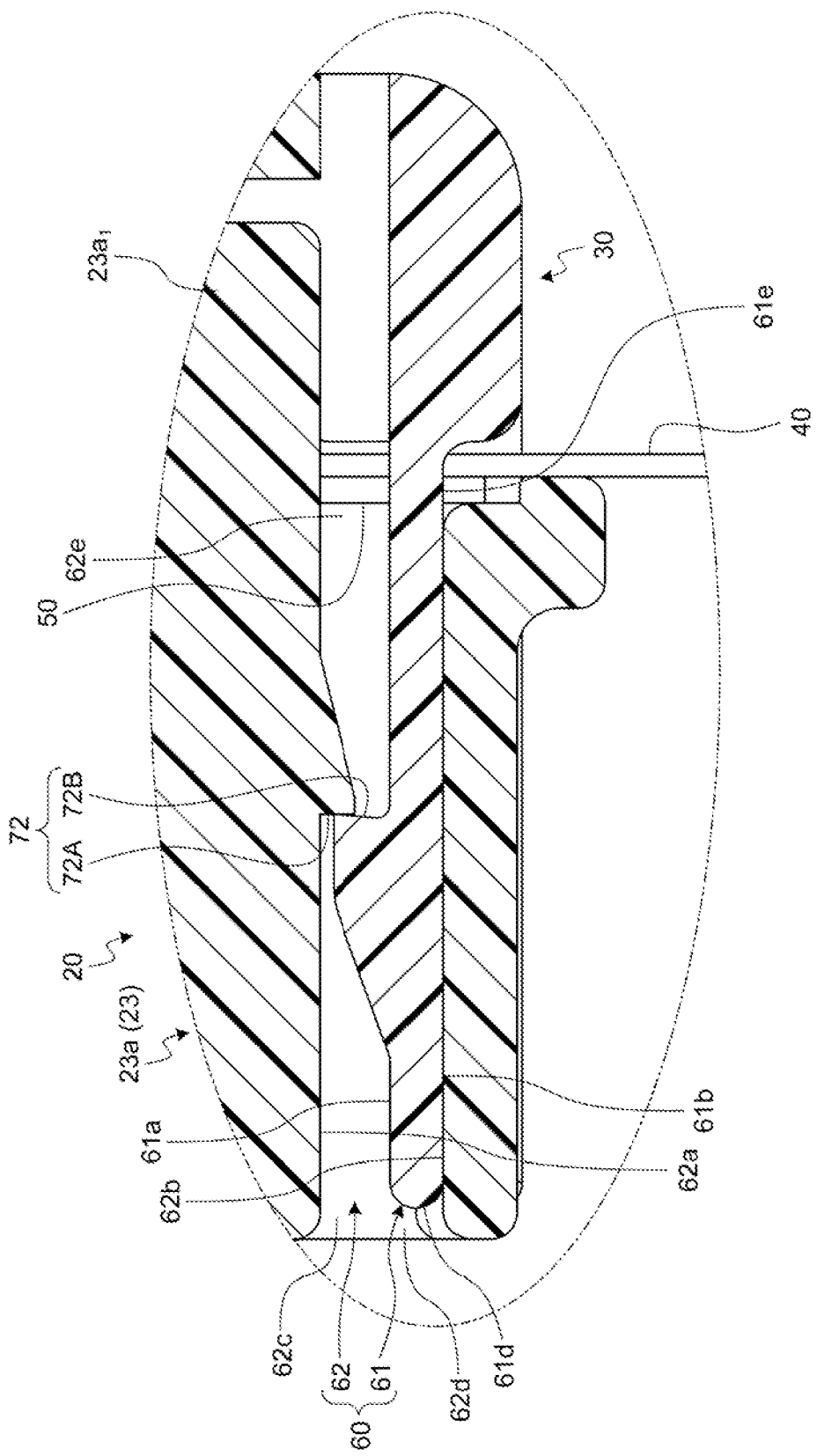
FIG. 9 is a fragmentary enlarged view of a section taken along X-X line of FIG. 2.
Figure 10:
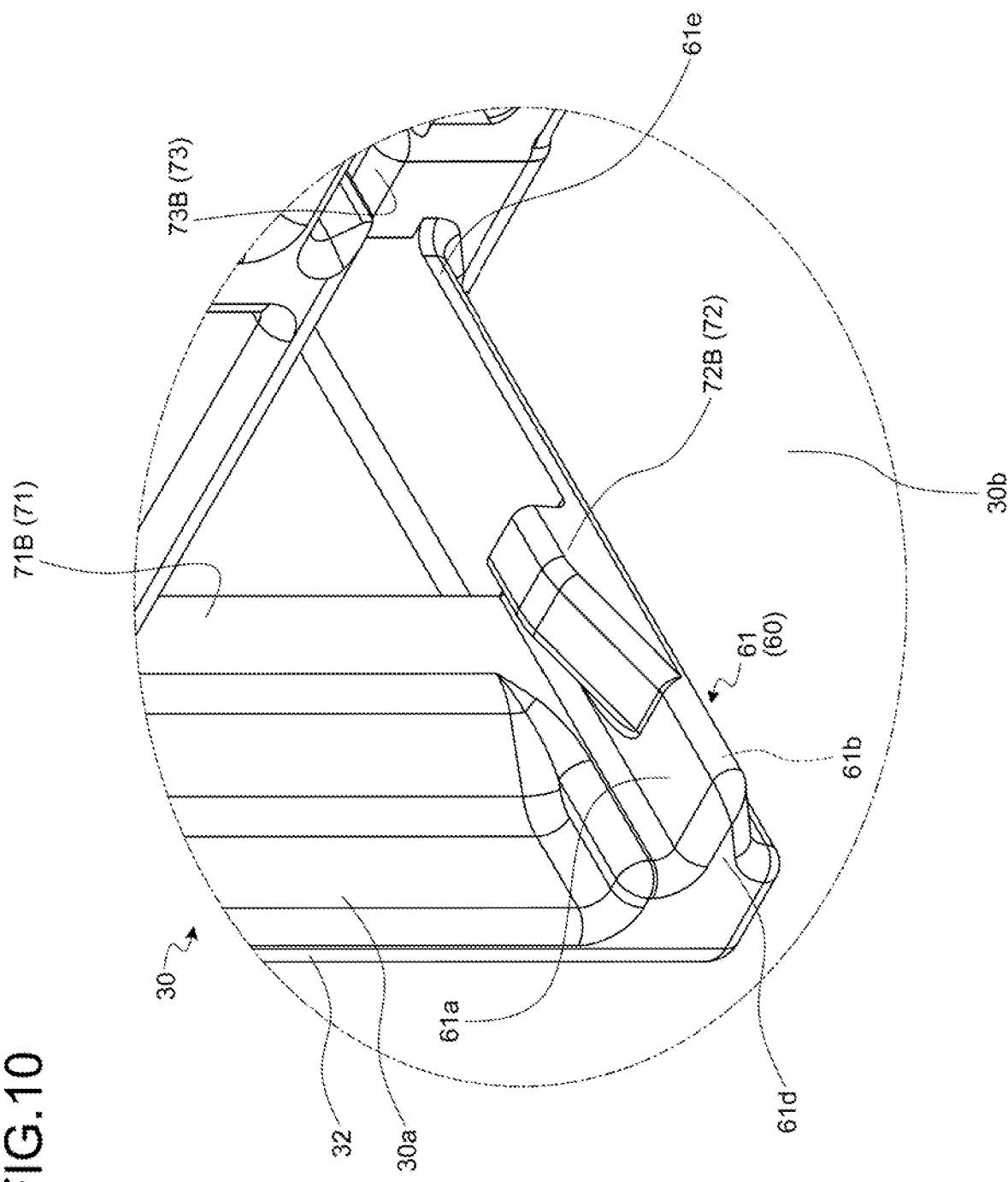
FIG. 10 is an enlarged view of part A of FIG. 4.

The guide protrusion 61 discussed herein is formed as a wedge-shaped protrusion with two planes (a first protrusion wall face 61a and a second protrusion wall face 61b) along the connecting direction thereof intersecting with each other (FIG. 9 and FIG. 10). As for the guide protrusion 61, the second protrusion wall face 61b is disposed closer to the lead-out direction side of the conductive component 40 than the first protrusion wall face 61a is. Furthermore, the first protrusion wall face 61a is formed as a plane that is along the connecting direction and the width direction of the housing 20 and the cover 30 (that is, a plane orthogonal to the lead-out direction of the conductive component 40).

Figure 11:
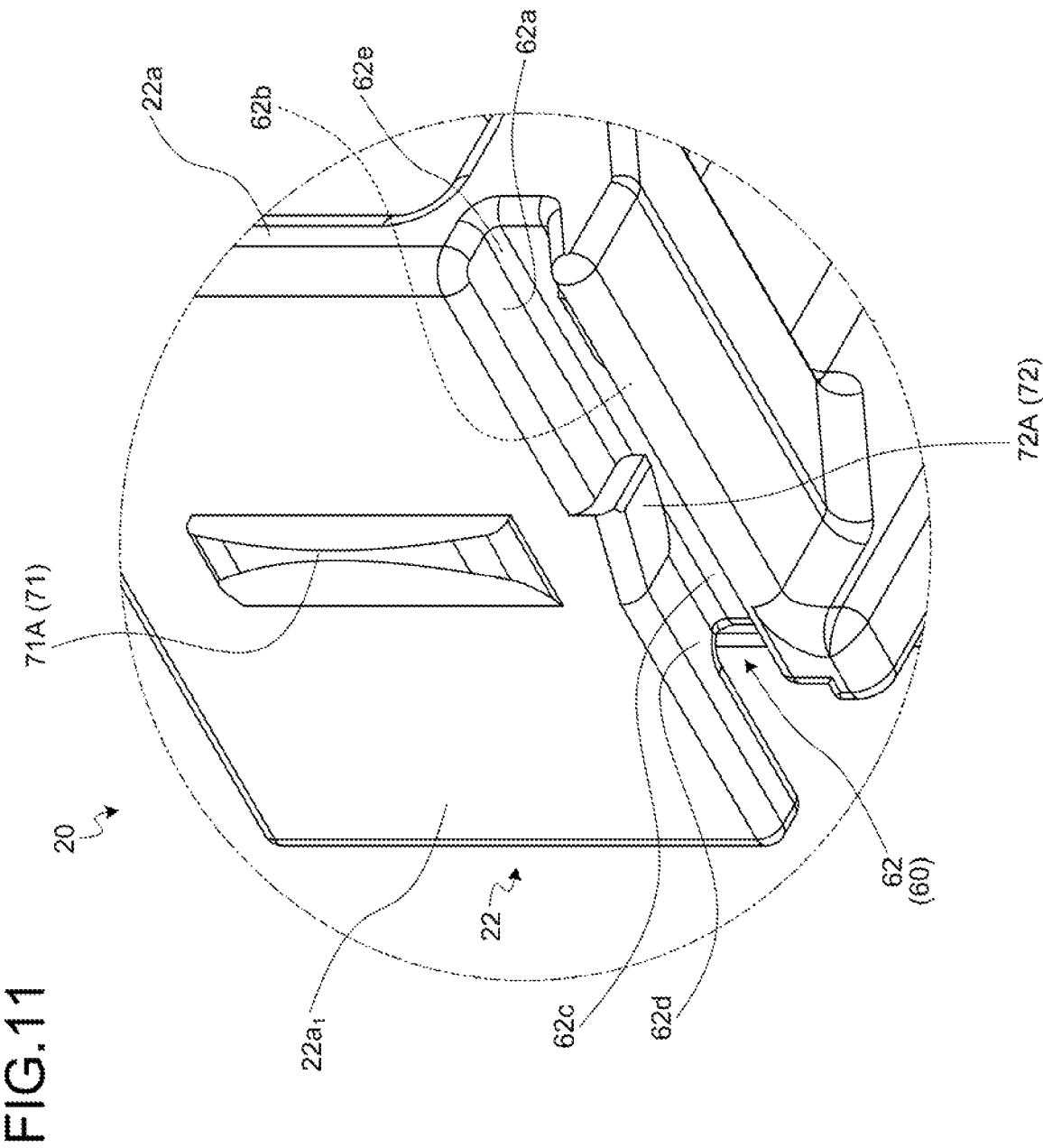
FIG. 11 is an enlarged view of part B of FIG. 6.

Furthermore, the guide groove 62 discussed herein includes a first groove wall face 62a disposed by opposing to the first protrusion wall face 61a, and a second groove wall face 62b disposed by opposing to the second protrusion wall face 61b. Furthermore, the guide groove 62 discussed herein includes a third groove wall face 62c as a groove base that connects the first groove wall face 62a and the second groove wall face 62b (FIG. 9 and FIG. 11). The first groove wall face 62a is formed as the plane along the connecting direction and the width direction of the housing 20 and the cover 30 (the plane orthogonal to the lead-out direction of the conductive component 40), and it is disposed by opposing to the first protrusion wall face 61a in a parallel state with a space provided therebetween.

As for the guide structure 60 when the housing 20 and the cover 30 are being completely assembled, a leading end 61d of the guide protrusion 61 and a leading end 62d of the guide groove 62 are disposed at equivalent positions in the connecting direction of the housing 20 and the cover 30, and a rear end 61e of the guide protrusion 61 and a rear end 62e of the guide groove 62 are disposed at equivalent positions (FIG. 9). Thus, in the guide structure 60, when the guide protrusion 61 is inserted into the rear end 62e of the guide groove 62 on the first outer wall face 21a side from the leading end 61d on the first opening 30a side and the housing 20 and the cover 30 are in a completely assembled state, the leading ends 61d, 62d are disposed by opposing to each other and the rear ends 61e, 62e are disposed by opposing to each other, in the first protrusion wall face 61a and the first groove wall face 62a as a pair; and the leading ends 61d, 62d are disposed by opposing to each other and the rear ends 61e, 62e are disposed by opposing to each other, in the second protrusion wall face 61b and the second groove wall face 62b as a pair.

In the connector 1 discussed herein, the guide structure 60 is provided in two areas. The guide structures 60 in the two areas are provided such that the protruding direction of one of the guide protrusions 61 and the protruding direction of the other guide protrusion 61 are opposite from each other. The guide protrusion 61 discussed herein is provided to the first cover sidewall 32 and the second cover sidewall 33 of the cover 30. Herein, the guide protrusion 61 is formed in the side portion on the second opening 30b side of each of the first cover sidewall 32 in a rectangular planar shape and the second cover sidewall 33 in a rectangular planar shape. In the cover 30, each of the guide protrusions 61 is protruded toward the inner side, and disposed to oppose to each other. Furthermore, the guide groove 62 discussed herein is provided to the first housing sidewall 22 and the second housing sidewall 23 of the housing 20. The guide groove 62 on the first housing sidewall 22 is disposed adjacent to the flat plate part 22a on the sixth outer wall face 21f side. The guide groove 62 on the second housing sidewall 23 is disposed adjacent to the flat plate part 23a on the sixth outer wall face 21f side.

Furthermore, a main locking structure 71 and an auxiliary locking structure 72 are provided between the housing 20 and the cover 30 for maintaining those in a completely assembled state by locking the move of the cover 30 toward the connector removal direction to the housing 20 when the housing 20 and the cover 30 are in a completely assembled state (FIG. 1 to FIG. 6). In other words, the main locking structure 71 and the auxiliary locking structure 72 lock the move in the opposite direction of the connecting direction of the housing 20 and the cover 30 (that is, in detaching direction of the housing 20 and the cover 30) when the housing 20 and the cover 30 are in a completely assembled state so as to maintain those in a completely assembled state.

Figure 12:
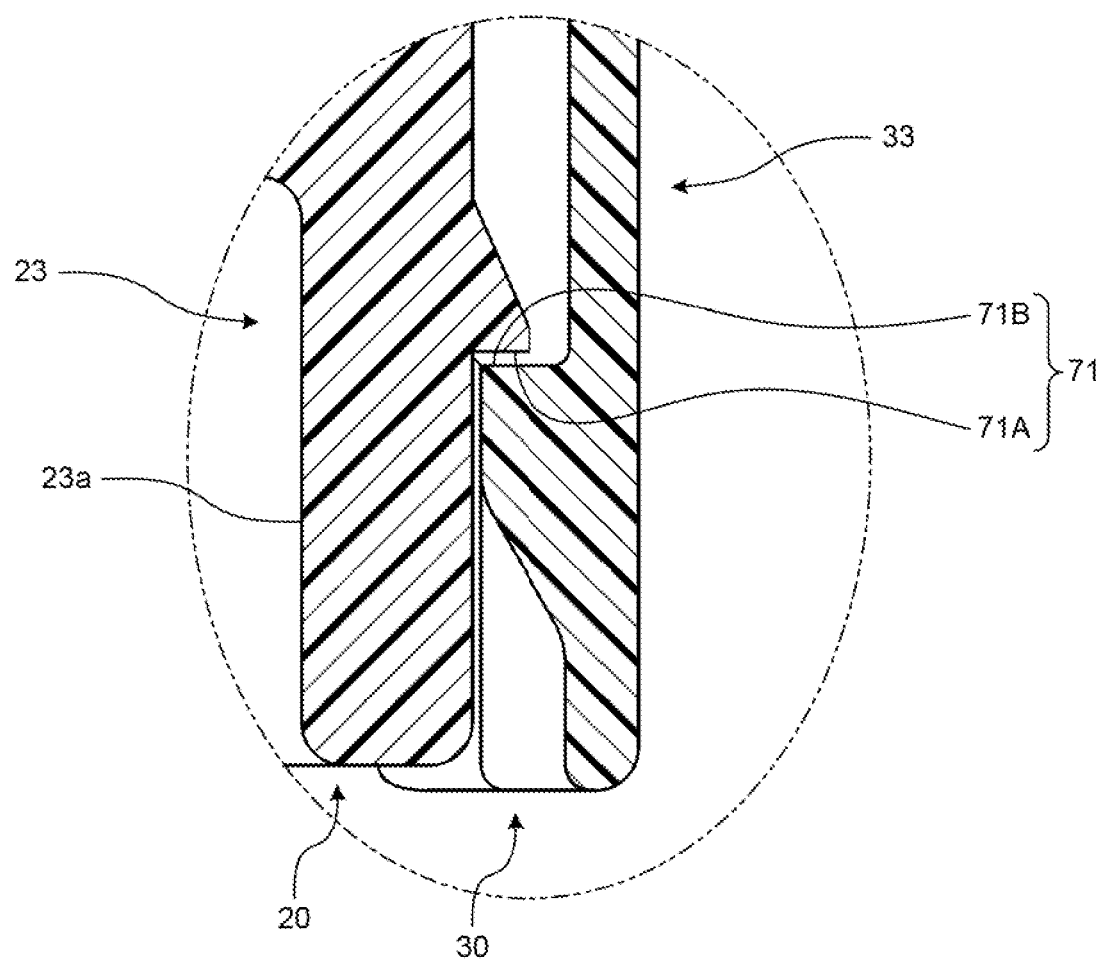
FIG. 12 is a fragmentary enlarged view of a section taken along Y-Y line of FIG. 2

The main locking structure 71 includes: a first main locking body 71A that is provided to the housing 20; and a second main locking body 71B that is provided to the cover 30 and engaged with the first main locking body 71A to maintain the housing 20 and the cover 30 in a completely assembled state, when the housing 20 and the cover 30 are in a completely assembled state (FIG. 4, FIG. 6, and FIG. 12). The first main locking body 71A and the second main locking body 71B are disposed by opposing to each other so as to lock the move in the opposite direction of the connecting direction when the housing 20 and the cover 30 are in a completely assembled state.

The main locking structure 71 is provided at two areas that are between the first housing sidewall 22 and the first cover sidewall 32 and between the second housing sidewall 23 and the second cover sidewall 33. That is, the first main locking body 71A is provided on each of the first housing sidewall 22 and the second housing sidewall 23. Furthermore, the second main locking body 71B is provided on each of the first cover sidewall 32 and the second cover sidewall 33. Herein, each of the first main locking body 71A and the second main locking body 71B is formed as a protrusion. The first main locking bodies 71A are protruded toward the outer side from the outer wall faces of a flat plate part 22a of the first housing sidewall 22 and a flat plate part 23a of the second housing sidewall 23, respectively (FIG. 12). The first main locking bodies 71A are formed such that the protruding directions thereof are opposite from each other. The first main locking body 71A discussed herein is a plane that is provided to hang downward from each of the outer wall faces of the flat plate parts 22a and 23a and that faces the connector insertion direction, and has a locking face extended toward the lead-out direction of the conductive component 40. Furthermore, the second main locking bodies 71B are protruded toward the inner side from the inner wall faces of the first cover sidewall 32 and the second cover sidewall 33, respectively (FIG. 12). The second main locking bodies 71B are formed such that the protruding directions thereof are opposite from each other. The second main locking body 71B discussed herein is a plane that is provided to hang downward from each of the inner wall faces of the first cover sidewall 32 and the second cover sidewall 33 and that faces the connector removal direction, and has a locking face extended toward the lead-out direction of the conductive component 40.

The first cover sidewall 32 and the second cover sidewall 33 discussed herein have flexibility as described above. Therefore, with the connector 1, when the housing 20 and the cover 30 are being inserted and connected along the guide structure 60, the first main locking bodies 71A and the second main locking bodies 71B as pairs apply the force to the inclined faces of each other, thereby causing deflection of the first cover sidewall 32 toward the direction leaving away from the first housing sidewall 22 and deflection of the second cover sidewall 33 toward the direction leaving away from the second housing sidewall 23. In the connector 1, the first main locking bodies 71A and the second main locking bodies 71B as pairs are shifted each other while deflection of the first cover sidewall 32 and the second cover sidewall 33 is caused, thereby the deflection of the first cover sidewall 32 and the second cover sidewall 33 as well as the shift are eliminated, so that the second main locking bodies 71B are opposingly disposed to the first main locking bodies 71A on the connector insertion direction side. Thereby, in the connector 1, the locking faces of the first main locking body 71A and the second main locking body 71B are opposingly disposed to be in a state capable of locking the housing 20 and the cover 30 in the detaching direction (the direction opposite from the connecting direction). In the connector 1, the deflection amount of the first cover sidewall 32 and the second cover sidewall 33 becomes the largest when the first main locking body 71A and the second main locking body 71B as a pair are in a state capable of shifting each other.

The auxiliary locking structure 72 includes: a first auxiliary locking body 72A that is provided to the housing 20; and a second auxiliary locking body 72B that is provided closer to the cover 30 on the second opening 30b side than the second main locking body 71B is, and engaged with the first auxiliary locking body 72A to maintain the housing 20 and the cover 30 in a completely assembled state, when the housing 20 and the cover 30 are in a completely assembled state (FIG. 4, FIG. 6, and FIG. 9 to FIG. 11). The first auxiliary locking body 72A and the second auxiliary locking body 72B are disposed by opposing to each other so as to lock the move in the opposite direction of the connecting direction when the housing 20 and the cover 30 are in a completely assembled state.

As for the auxiliary locking structure 72, the second auxiliary locking body 72B is provided closer to the second opening 30b side than the second main locking body 71B is. Thus, the first auxiliary locking body 72A is also provided closer to the sixth outer wall face 21f side than the first main locking body 71A is (in other words, on the second opening 30b side when the housing 20 and the cover 30 are in a completely assembled state). Specifically, in the housing 20, the first main locking body 71A and the first auxiliary locking body 72A are disposed at equivalent positions in the connector insertion/removal direction (the connector insertion direction or the connector removal direction), and the first auxiliary locking body 72A is disposed closer to the sixth outer wall face 21f side than the first main locking body 71A is (FIG. 11). Furthermore, in the cover 30, the second main locking body 71B and the second auxiliary locking body 72B are disposed at equivalent positions in the connector insertion/removal direction, and the second auxiliary locking body 72B is disposed closer to the second opening 30b side than the second main locking body 71B is (FIG. 10).

The auxiliary locking structure 72 is provided at two areas that are between the first housing sidewall 22 and the first cover sidewall 32 and between the second housing sidewall 23 and the second cover sidewall 33. That is, the first auxiliary locking body 72A is provided on each of the first housing sidewall 22 and the second housing sidewall 23. Furthermore, the second auxiliary locking body 72B is provided on each of the first cover sidewall 32 and the second cover sidewall 33. Herein, each of the first auxiliary locking body 72A and the second auxiliary locking body 72B is formed as a protrusion. The first auxiliary locking body 72A is protruded from the first groove wall face 62a of the guide groove 62 in each of the first housing sidewall 22 and the second housing sidewall 23 (FIG. 9 and FIG. 11). The first auxiliary locking body 72A discussed herein includes a locking face formed with a plane that is provided to hang downward from each of the first groove wall faces 62a that faces the connector insertion direction. Furthermore, the second auxiliary locking body 72B is protruded from the first protrusion wall face 61a of the guide protrusion 61 in each of the first cover sidewall 32 and the second cover sidewall 33 (FIG. 9 and FIG. 10). The second auxiliary locking body 72B discussed herein includes a locking face formed with a plane that is provided to hang downward from each of the first protrusion wall faces 61a and faces the connector removal direction.

In the connector 1, it is desirable to provide the second main locking body 71B and the second auxiliary locking body 72B on the first opening 30a side of each of the first cover sidewall 32 and the second cover sidewall 33. That is, it is desirable to provide the second auxiliary locking body 72B on the first opening 30a side where the deflection amounts of the first cover sidewall 32 and the second cover sidewall 33 are greater than that on the cover main wall 31 side. The second auxiliary locking body 72B discussed herein is provided further on the second opening 30b side of each of the first cover sidewall 32 and the second cover sidewall 33. That is, the second auxiliary locking foody 72B discussed herein is provided in the intersection part of the first opening 30a side and the second opening 30b side where the deflection amounts of the first cover sidewall 32 and the second cover sidewall 33 are the largest.

As described above, with the connector 1, when the housing 20 and the cover 30 are being inserted and connected along the guide structure 60, the first main locking bodies 71A and the second main locking bodies 71B as pairs apply the force to the inclined faces of each other, thereby causing deflection of the first cover sidewall 32 toward the direction leaving away from the first housing sidewall 22 and deflection of the second cover sidewall 33 toward the direction leaving away from the second housing sidewall 23. In the connector 1, due to the deflection of the first cover sidewall 32 and the second cover sidewall 33, the second auxiliary locking bodies 72B provided on the first cover sidewall 32 and the second cover sidewall 33 also move away from the first housing sidewall 22 and the second housing sidewall 23.

For example, when the deflection amounts of the first cover sidewall 32 and the second cover sidewall 33 becomes the largest in the connector 1, the first auxiliary locking bodies 72A and the second auxiliary locking bodies 72B as pairs are not opposingly disposed in the connecting direction of the housing 20 and the cover 30. Thereby, with the connector 1, the first auxiliary locking bodies 72A and the second auxiliary locking bodies 72B as pairs can be shifted with each other when the first main locking bodies 71A and the second main locking bodies 71B as pairs are shifted with each other. Therefore, in the connector 1, the deflection of the first cover sidewall 32 and the second cover sidewall 33 is eliminated and the second main locking bodies 71B are disposed by opposing to the first main locking bodies 71A on the connector insertion direction side, and at the same time, the second auxiliary locking bodies 72B are disposed by opposing to the first auxiliary locking bodies 72A on the connector insertion direction side. Thereby, in the connector 1, the locking faces of the first main locking bodies 71A and the second main locking bodies 71B as pairs can be opposingly disposed to be in a state capable of locking the housing 20 and the cover 30 in the detaching direction, and the locking faces of the first auxiliary locking bodies 72A and the second auxiliary locking bodies 72B as pairs can be opposingly disposed to be in a state capable of locking the housing 20 and the cover 30 in the detaching direction.

As described, in the connector 1, the auxiliary locking structure 72 separate from the main locking structure 71 is also provided between the housing 20 and the cover 30, and the auxiliary locking structure 72 is configured to be disposed closer to the second opening 30*b* side than the main locking structure 71 is. Thus, with the deflection of the first cover sidewall 32 and the second cover sidewall 33, it is possible to lighten the resistance between the first auxiliary locking body 72A and the second auxiliary locking body 72B when assembling the housing 20 and the cover 30, so that increase in the assembly force at the time of assembly can be suppressed. Furthermore, with the connector 1, it is possible to maintain the housing 20 and the cover 30 in a completely assembled state by the main locking structure 71 and the auxiliary locking structure 72, even when a force is applied to the cover 30 when the fitting connection part 21*g* is pulled out from the mating fitting connection part 521*g*. As described, the connector 1 is capable of preventing the cover 30 from coming off from the housing 20 during a connector removal operation, while suppressing the increase in the assembly force for the housing 20 and the cover 30.

However, in the connector 1 in this case, when the lockable state of the first main locking body 71A and the second main locking body 71B as a pair in the detaching direction is released due to the deflection of the first cover sidewall 32 and the second cover sidewall 33, the lockable state of the first auxiliary locking body 72A and the second auxiliary locking body 72B as a pair in the detaching direction is also released. For example, at the outer wall face of each of the first cover sidewall 32 and the second cover sidewall 33 on the connector removal direction side, a grip part 34 is provided so as to be held by gripping with the finger when the fitting connection part 21*g* is pulled out from the mating fitting connection part 521*g* (FIG. 1 to FIG. 6). Therefore, with the connector 1, it is possible to apply the force in the connector removal direction while gripping the grip parts 34 with the fingers when pulling out the fitting connection part 21*g* from the mating fitting connection part 521*g*. In the meantime, however, with the connector 1, the first cover sidewall 32 and the second cover sidewall 33 are pinched in the connector removal direction thereof by the fingers, so that the first cover sidewall 32 and the second cover sidewall 33 may be deflected and the first opening 30*a* side and the second opening 30*b* side of each of the first cover sidewall 32 and the second cover sidewall 33 may be separated from the first housing sidewall 22 and the second housing sidewall 23. Thus, with the connector 1, when the first cover sidewall 32 and the second cover sidewall 33 are held and deflected when the fitting connection part 21*g* is pulled out from the mating fitting connection part 521*g*, the lockable state in the detaching direction is released both between the first main locking body 71A and the second main locking body 71B as a pair and between the first auxiliary locking body 72A and the second auxiliary locking body 72B as a pair.

Thus, even when the lockable state of the first main locking body 71A and the second main locking body 71B as a pair in the detaching direction is released due to the deflection of the first cover sidewall 32 and the second cover sidewall 33, the second auxiliary locking body 72B is disposed by opposing to the first auxiliary locking body 72A on the connector insertion direction side. Thereby, with the connector 1, even when the first cover sidewall 32 and the second cover sidewall 33 of the cover 30 are held when the fitting connection part 21*g* is pulled out from the mating fitting connection part 521*g*, and a lockable state of the first main locking body 71A and the second main locking body 71B as a pair in the detaching direction is released, it is possible to maintain the lockable state of the first auxiliary locking body 72A and the second auxiliary locking body 72B as a pair in the detaching direction. Therefore, the connector 1 is capable of preventing the cover 30 from coming off from the housing 20 even when the first cover sidewall 32 and the second cover sidewall 33 of the cover 30 are held when the fitting connection part 21*g* is pulled out from the mating fitting connection part 521*g*.

Meanwhile, the opposing area of the locking faces of the first auxiliary locking body 72A and the second auxiliary locking body 72B as a pair is smaller when the lockable state of the first main locking body 71A and the second main locking body 71B as a pair is released than the opposing area of a state where the housing 20 and the cover 30 are in a completely assembled state due to the deflection of the first cover sidewall 32 and the second cover sidewall 33. That is, in the connector 1 of the embodiment, the auxiliary locking structure 72 is disposed closer to the second opening 30*b* side than the main locking structure 71 is. Therefore, it is possible to lighten the resistance between the first auxiliary locking body 72A and the second auxiliary locking body 72B at the time of assembling the housing 20 and the cover 30 even though it is still larger than the case discussed above, so that the increase in the assembly force can be suppressed at the time of assembly. For example, a shape (for example, an inclined face) may be provided to the first auxiliary locking body 72A and the second auxiliary locking body 72B as a pair for allowing them to be shifted with each other when assembling the housing 20 and the cover 30. Thereby, when the housing 20 and the cover 30 are assembled, the first auxiliary locking body 72A and the second auxiliary locking body 72B as a pair can be shifted with each other by further deflecting the first cover sidewall 32 and the second cover sidewall 33 by the force applied to the inclined faces of each other.

As described above, the connector 1 of the embodiment is capable of preventing the cover 30 from coming off from the housing 20 at the time of the connector removal operation while suppressing the increase in the assembly force for the housing 20 and the cover 30.

Figure 2:
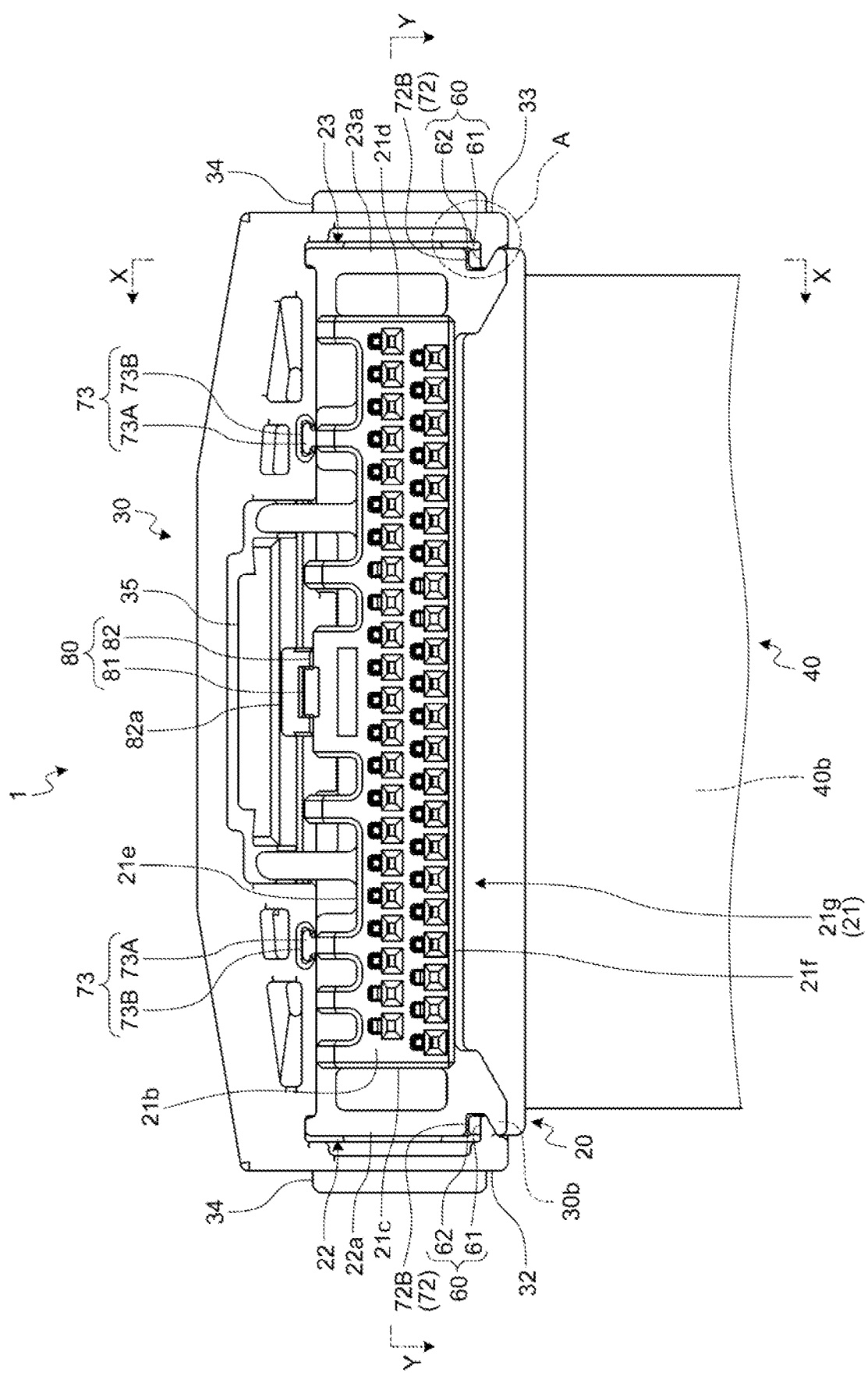
FIG. 2 is a plan view of the connector of the embodiment when viewed from a fitting connection part side.

Note that the connector 1 is provided with a locking structure (hereinafter, referred to as "orthogonal locking structure") 73 that locks the housing 20 and the cover 30 in an orthogonal direction with respect to the locking direction of the main locking structure 71 and the auxiliary locking structure 72 (FIG. 1, FIG. 2, and FIG. 4). The orthogonal locking structure 73 is provided between the housing 20 and the cover 30 and configured to lock the move in the orthogonal direction (that is, the lead-out direction of the conductive component 40) to the connecting direction of each other when the housing 20 and the cover 30 are in a completely assembled state, and to the opposingly disposed direction (width direction) of the first cover sidewall 32 and the second cover sidewall 33. The orthogonal locking structure 73 includes a first locking body 73A provided to the housing 20 and a second locking body 73B provided to the cover 30.

In the orthogonal locking structure 73 illustrated herein, the first locking body 73A is provided in a protruded state on the first outer wall face 21a side of the fifth outer wall face 21e of the housing main body 21, and the second locking body 73B is formed on the second wall body 31B of the cover 30 as a locking groove with which the first locking body 73A is engaged. The first locking body 73A and the second locking body 73B form a three-dimensional shape extended along the connecting direction with substantially a trapezoid orthogonal section to the connecting direction of the housing 20 and the cover 30. The first locking body 73A and the second locking body 73B are formed such that the upper base of substantially the trapezoid orthogonal section faces toward the fifth outer wall face 21e side. Therefore, the first locking body 73A and the second locking body 73B lock the relative move of the conductive component 40 in the lead-out direction when the housing 20 and the cover 30 are in a completely assembled state. Furthermore, the first locking body 73A and the second locking body 73B also function as a guide structure when the housing 20 and the cover 30 are inserted and connected. In the connector 1 discussed herein, the orthogonal locking structure 73 is provided in two areas.

Furthermore, in the connector 1, as described above, the fitting connection part 21g of the housing main body 21 is fitted and connected to the mating fitting connection part 521g of the mating housing 520. Herein, the mating fitting connection part 521g is formed in a rectangular tubular shape, and the fitting connection part 21g is inserted and fitted to the inner side of the mating fitting connection part 521g. Between the housing 20 and the mating housing 520, a holding structure 80 is provided for maintaining the completely fitted and connected state (FIG. 1, FIG. 2, and FIG. 4 to FIG. 6). As the structural elements of the holding structure 80, the housing 20 includes: a locking body 81 that is engaged with a mating locking body 521h of the mating fitting connection part 521g (FIG. 8) in the opposite direction of the fitting-connecting direction when the fitting connection part 21g and the mating fitting connection part 521g are in a completely fitted and connected state so as to maintain the fitting connection part 21g and the mating fitting connection part 521g in a completely fitted and connected state; and a locking release arm 82 that releases the lockable state of the locking body 81 and the mating locking body 521h by being deflected upon a locking release force applied to a force point 82a.

The locking body 81 and the locking release arm 82 are arranged on the opposite side of the second opening 30b side of the housing 20 (that is, on the fifth outer wall face 21e side of the housing 20) when the housing 20 and the cover 30 are in a completely assembled state. Furthermore, the locking release arm 82 is formed to be operated by being pushed toward the second opening 30b side (that is, toward the fifth outer wall face 21e) when the lockable state of the locking body 81 and the mating locking body 521h is released. The locking release arm 82 has the force point 82a as an area for allowing an operator to perform the pushing operation.

Herein, the locking body 81 is formed as a locking protrusion, and the mating locking body 521h is formed as a perforated hole to which the locking body 81 is inserted and engaged. The locking body 81 discussed herein is engaged with a peripheral wall of the mating locking body 521h as the perforated hole. Furthermore, the locking release arm 82 is in a cantilever form that can be elastically deformed with the fixed end being the fulcrum. Herein, the fixed end is provided on the fitting connection part 21g side of the fifth outer wall face 21e, and the free end is provided on the first outer wall face 21a side of the fifth outer wall face 21e (part excluding the fitting connection part 21g). As for the locking release arm 82, the free end is the force point 82a. The force point 82a herein is formed in a rectangular planar shape. Furthermore, the locking release arm 82 has wall faces opposingly disposed with a space provided therebetween on the fitting connection part 21g side of the fifth outer wall face 21e of the housing main body 21. In the locking release arm 82, on the wall face on the opposite side from the wall faces mentioned above, the locking body 81 is provided in a protruded state between the fixed end and the free end. With the locking release arm 82 formed in this manner, a locking release force toward the fifth outer wall face 21e is applied to the force point 82a, when the lockable state of the locking body 81 and the mating locking body 521h is released. With the holding structure 80, the locking release arm 82 is deflected by the locking release force and the locking body 81 is displaced toward the fifth outer wall face 21e side concurrently with the deflection of the locking release arm 82, thereby releasing the lockable state of the locking body 81 and the mating locking body 521h.

As for the cover 30 as described above, the second wall body 31B is disposed by opposing to the first outer wall face 21a side of the fifth outer wall face 21e with a space provided therebetween, so that not only the first outer wall face 21a side of the fifth outer wall face 21e but also the free end (that is, the force point 82a) of the locking release arm 82 is covered with the second wall body 31B. Therefore, the second wall body 31B is provided with a pushing part 35 that covers the force point 82a and pushes and moves the force point 82a toward the fifth outer wall face 21e side by being displaced toward the second opening 30b side (the fifth outer wall face 21e side) (FIG. 1, FIG. 2, and FIG. 4 to FIG. 6). The pushing part 35 is formed in a cantilever form having flexibility. The pushing part 35 discussed herein is formed in a piece element with the first wall body 31A side being the fixed end and the first opening 30a side being the free end. By being pushed toward the fifth outer wall face 21e side, the pushing part 35 pushes and moves the force point 82a in a contact state toward the fifth outer wall face 21e side to release the lockable state of the locking body 81 and the mating locking body 521h.

Note here that with the connector 1, when the fitting connection part 21g is pulled out from the mating fitting connection part 521g, the lockable state between the locking body 81 and the mating locking body 521h is released by pushing the pushing part 35 of the cover 30 with a finger while different fingers of the same hand hold the first cover sidewall 32 and the second cover sidewall 33 of the cover 30, for example. At that time, in the connector 1, if the push amount of the pushing part 35 is insufficient and the lockable state of the locking body 81 and the mating locking body 521*h* is not completely released, the operator may unintentionally increase the force in the pulling direction of the fitting connection part 21*g* (the connector removal direction) while increasing the gripping force for the first cover sidewall 32 and the second cover sidewall 33. Furthermore, in the cover 30 in that case, an unexpected force may be applied such as a force for causing deflection of the first cover sidewall 32 and the second cover sidewall 33 toward the directions leaving away from the first housing sidewall 22 and the second housing sidewall 23, a rotational force for the housing 20 having the locking point of the locking body 81 and the mating locking body 521*h* as the fulcrum, or the like. However, even when the lockable state of the first main locking body 71A and the second main locking body 71B as a pair in the detaching direction is released due to such an unexpected force applied when the fitting connection part 21*g* is pulled out from the mating fitting connection part 521*g*, it is possible with the connector 1 to maintain the first auxiliary locking body 72A and the second auxiliary locking body 72B as a pair in a lockable state in the detaching direction in the manner as described above, thereby making it possible to prevent the cover 30 from being detached from the housing 20.

As described, the connector 1 of the embodiment is capable of preventing the cover 30 from coming off from the housing 20 while suppressing the increase in the assembly force for the housing 20 and the cover 30, even when an unexpected force is applied to the cover 30 at the time of the connector removal operation.

In the connector according to the present embodiment, the auxiliary locking structure separate from the main locking structure is provided between the housing and the cover, and the auxiliary locking structure is configured to be disposed closer to the second opening side than the main locking structure is. This makes it possible to lighten the resistance between the first auxiliary locking body and the second auxiliary locking body when the housing and the cover are assembled by the deflection of the first cover sidewall and the second cover sidewall, so that the increase in the assembly force can be suppressed at the time of assembly. Furthermore, with the connector, even when a force is applied to the cover when the fitting connection part is pulled out from the mating fitting connection part, it is possible to maintain the housing and the cover in a completely assembled state with the main locking structure and the auxiliary locking structure. As described above, the connector according to the present embodiment is capable of preventing the cover from coming off from the housing at the time of the connector removal operation while suppressing the increase in the assembly force for the housing and the cover.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
    a terminal fitting;
    a housing that includes a fitting connection part capable of being fitted and connected to a mating fitting connection part along a connector insertion direction and capable of being pulled out from the mating fitting connection part along a connector removal direction, the housing accommodating the terminal fitting inside the fitting connection part;
    a cover that is assembled to the housing and covers a protruded part of the housing from the mating fitting connection part from an outer side when the fitting connection part and the mating fitting connection part are in a completely fitted and connected state; and
    a conductive component that is electrically connected to the terminal fitting and led out to an outer side from an outlet formed with the housing and the cover in a completely assembled state, wherein
    the cover includes: a cover main wall forming a main body for covering the protruded part; a first cover sidewall and a second cover sidewall having flexibility, the first cover sidewall and the second cover sidewall being opposingly disposed with a space provided from each other and being joined, respectively, to both ends of the cover main wall in an orthogonal state; a first opening having, as a peripheral edge, end portions of each of the cover main wall, the first cover sidewall, and the second cover sidewall on the connector insertion direction side; and a second opening having, as a peripheral edge, end portions of each of the cover main wall, the first cover sidewall, and the second cover sidewall in an orthogonal direction with respect to an opposingly disposed direction of the first cover sidewall and the second cover sidewall and with respect to the connector insertion direction, a part of the second opening being used as the outlet,
    the housing includes: a first housing sidewall disposed by opposing to the first cover sidewall in the completely assembled state; and a second housing sidewall disposed by opposing to the second cover sidewall in the completely assembled state,
    a main locking structure and an auxiliary locking structure are provided between the housing and the cover for locking move of the cover in the connector removal direction with respect to the housing when the housing and the cover are in the completely assembled state so as to maintain the housing and the cover in the completely assembled state,
    the main locking structure includes: a first main locking body that is provided to the housing; and a second main locking body that is provided to the cover, and engaged with the first locking body in the completely assembled state to maintain the housing and the cover in the completely assembled state,
    the auxiliary locking structure includes: a first auxiliary locking body that is provided to the housing; and a second auxiliary locking body that is provided to the cover on the second opening side than the second main locking body is, and engaged with the first auxiliary locking body in the completely assembled state to maintain the housing and the cover in the completely assembled state,
    the first main locking body and the first auxiliary locking body are provided to each of the first housing sidewall and the second housing sidewall, and
    the second main locking body and the second auxiliary locking body are provided to each of the first cover sidewall and the second cover sidewall.

2. The connector according to claim 1, wherein
    the second main locking body and the second auxiliary locking body are provided to each of the first cover sidewall and the second cover sidewall on the first opening side.

3. The connector according to claim 1, wherein
the second main locking body is provided to each of the first cover sidewall and the second cover sidewall on the first opening side, and
the second auxiliary locking body is provided to each of the first cover sidewall and the second cover sidewall on the first opening side and the second opening side.

4. The connector according to claim 1, further comprising:
a grip part that is provided to outer wall faces of each of the first cover sidewall and the second cover sidewall on the connector removal direction side, the grip part being able to be caught and held by a finger when the fitting connection part is pulled out from the mating fitting connection part.

5. The connector according to claim 1, wherein
the housing includes: a locking body that is engaged with a mating locking body provided to the mating fitting connection part when the fitting connection part and the mating fitting connection part are in the completely fitted and connected state so as to maintain the fitting connection part and the mating fitting connection part in the completely fitted and connected state; and a locking release arm that releases a lockable state of the locking body and the mating locking body,
the locking body and the locking release arm are disposed in the housing on an opposite side of the second opening side in the completely assembled state,
the locking release arm includes a force point to be pushed and operated toward the second opening side when releasing the lockable state of the locking body and the mating locking body, and
the cover includes a pushing part that covers the force point and pushes and moves the force point toward the second opening side by being displaced toward the second opening side.

6. The connector according to claim 1, wherein
the second auxiliary locking body is disposed by opposing to the first auxiliary locking body on the connector insertion direction side, even when a lockable state between the first main locking body and the second main locking body is released due to deflection of the first cover sidewall and the second cover sidewall.

7. The connector according to claim 6, wherein
the second main locking body and the second auxiliary locking body are provided to each of the first cover sidewall and the second cover sidewall on the first opening side.

8. The connector according to claim 6, wherein
the second main locking body is provided to each of the first cover sidewall and the second cover sidewall on the first opening side, and
the second auxiliary locking body is provided to each of the first cover sidewall and the second cover sidewall on the first opening side and the second opening side.

9. The connector according to claim 6, further comprising:
a grip part that is provided to outer wall faces of each of the first cover sidewall and the second cover sidewall on the connector removal direction side, the grip part being able to be caught and held by a finger when the fitting connection part is pulled out from the mating fitting connection part.

10. The connector according to claim 6, wherein
the housing includes: a locking body that is engaged with a mating locking body provided to the mating fitting connection part when the fitting connection part and the mating fitting connection part are in the completely fitted and connected state so as to maintain the fitting connection part and the mating fitting connection part in the completely fitted and connected state; and a locking release arm that releases a lockable state of the locking body and the mating locking body,
the locking body and the locking release arm are disposed in the housing on an opposite side of the second opening side in the completely assembled state,
the locking release arm includes a force point to be pushed and operated toward the second opening side when releasing the lockable state of the locking body and the mating locking body, and
the cover includes a pushing part that covers the force point and pushes and moves the force point toward the second opening side by being displaced toward the second opening side.

11. The connector according to claim 1, wherein
the first cover sidewall is formed to be flexibly deformed at least in a direction leaving away from the first housing sidewall, and
the second cover sidewall is formed to be flexibly deformed at least in a direction leaving away from the second housing sidewall.

12. The connector according to claim 11, wherein
the second main locking body and the second auxiliary locking body are provided to each of the first cover sidewall and the second cover sidewall on the first opening side.

13. The connector according to claim 11, wherein
the second main locking body is provided to each of the first cover sidewall and the second cover sidewall on the first opening side, and
the second auxiliary locking body is provided to each of the first cover sidewall and the second cover sidewall on the first opening side and the second opening side.

14. The connector according to claim 11, further comprising:
a grip part that is provided to outer wall faces of each of the first cover sidewall and the second cover sidewall on the connector removal direction side, the grip part being able to be caught and held by a finger when the fitting connection part is pulled out from the mating fitting connection part.

15. The connector according to claim 11, wherein
the housing includes: a locking body that is engaged with a mating locking body provided to the mating fitting connection part when the fitting connection part and the mating fitting connection part are in the completely fitted and connected state so as to maintain the fitting connection part and the mating fitting connection part in the completely fitted and connected state; and a locking release arm that releases a lockable state of the locking body and the mating locking body,
the locking body and the locking release arm are disposed in the housing on an opposite side of the second opening side in the completely assembled state,
the locking release arm includes a force point to be pushed and operated toward the second opening side when releasing the lockable state of the locking body and the mating locking body, and
the cover includes a pushing part that covers the force point and pushes and moves the force point toward the second opening side by being displaced toward the second opening side.

16. The connector according to claim 11, wherein
the second auxiliary locking body is disposed by opposing to the first auxiliary locking body on the connector insertion direction side, even when a lockable state between the first main locking body and the second main locking body is released due to deflection of the first cover sidewall and the second cover sidewall.

17. The connector according to claim 16, wherein
the second main locking body and the second auxiliary locking body are provided to each of the first cover sidewall and the second cover sidewall on the first opening side.

18. The connector according to claim 16, wherein
the second main locking body is provided to each of the first cover sidewall and the second cover sidewall on the first opening side, and
the second auxiliary locking body is provided to each of the first cover sidewall and the second cover sidewall on the first opening side and the second opening side.

19. The connector according to claim 16, further comprising:
a grip part that is provided to outer wall faces of each of the first cover sidewall and the second cover sidewall on the connector removal direction side, the grip part being able to be caught and held by a finger when the fitting connection part is pulled out from the mating fitting connection part.

20. The connector according to claim 16, wherein
the housing includes: a locking body that is engaged with a mating locking body provided to the mating fitting connection part when the fitting connection part and the mating fitting connection part are in the completely fitted and connected state so as to maintain the fitting connection part and the mating fitting connection part in the completely fitted and connected state; and a locking release arm that releases a lockable state of the locking body and the mating locking body,
the locking body and the locking release arm are disposed in the housing on an opposite side of the second opening side in the completely assembled state,
the locking release arm includes a force point to be pushed and operated toward the second opening side when releasing the lockable state of the locking body and the mating locking body, and
the cover includes a pushing part that covers the force point and pushes and moves the force point toward the second opening side by being displaced toward the second opening side.

* * * * *